(12) United States Patent
Ho

(10) Patent No.: US 6,809,949 B2
(45) Date of Patent: Oct. 26, 2004

(54) FERROELECTRIC MEMORY

(75) Inventor: Iu Meng Tom Ho, Milpitas, CA (US)

(73) Assignees: Symetrix Corporation, Colorado Springs, CO (US); IOTA Technology, Inc., San Jose, CA (US)

( * ) Notice: Subject to any disclaimer, the term of this patent is extended or adjusted under 35 U.S.C. 154(b) by 0 days.

(21) Appl. No.: 10/139,426

(22) Filed: May 6, 2002

(65) Prior Publication Data

US 2003/0206430 A1 Nov. 6, 2003

(51) Int. Cl.$^7$ .............................................. G11C 11/22
(52) U.S. Cl. ...................................... 365/145; 365/149
(58) Field of Search .................................. 365/145, 149

(56) References Cited

U.S. PATENT DOCUMENTS

| | | | |
|---|---|---|---|
| 4,873,664 A | 10/1989 | Eaton, Jr. | |
| 4,888,733 A | 12/1989 | Mobley | |
| 5,038,323 A | 8/1991 | Schwee | |
| 5,406,510 A | 4/1995 | Mihara et al. | |
| 5,598,366 A | 1/1997 | Kraus et al. | |
| 5,737,260 A | 4/1998 | Takata et al. | |
| 5,828,615 A | 10/1998 | Mukunoki et al. | |
| 5,966,318 A * | 10/1999 | Ramer et al. | 365/145 |
| 5,995,407 A | 11/1999 | Kamp | |
| 6,147,895 A * | 11/2000 | Kamp | 365/145 |
| 2002/0141223 A1 * | 10/2002 | Kang | 365/145 |
| 2004/0047174 A1 * | 3/2004 | Chen et al. | 365/145 |

FOREIGN PATENT DOCUMENTS

| | | |
|---|---|---|
| DE | 19963417 A1 | 7/2000 |
| EP | 0278167 A2 | 8/1988 |
| EP | 0757354 A2 | 2/1997 |
| EP | 0759620 A2 | 2/1997 |
| EP | 0938 096 A2 | 8/1999 |

OTHER PUBLICATIONS

Koike et. al., *A 60–ns 1–Mb Nonvolatile Ferroelectric Memory with Non–Driven Cell Plate Line Write/Read Scheme*, Session and Paper No. 23.1, 15 pages, NEC Corporation, Kanagawa, Japan.

Takashima et al., *High Density Chain Ferroelectric Random–Access Memory (CFRAM)*, Jun. 11–14, 1997, pp. 83 & 84, 4–930813–76–X 11–4, 1997 Symposium on VLSI Circuits Digest of Technical Papers.

Sumi et al., *A 256kb Nonvolatile Ferroelectric Memory at 3V and 100ns*, 0–7803–1844–7/94, pp. 268 & 269, 1994 IEEE International Solid–State Circuits Conference, ISSCC94/Session 16/Technology Directions: Memory Packaging/Paper FA 16.2.

* cited by examiner

Primary Examiner—Huan Hoang
(74) Attorney, Agent, or Firm—Patton Boggs LLP

(57) ABSTRACT

A ferroelectric memory including a bit line pair, a drive line parallel to and located between the bit lines, and an associated memory cell. The memory cell includes two capacitors, each capacitor connected to one of said bit lines via a transistor, and each capacitor is also connected to the drive line via a transistor. The gates of all three of the transistors are connected to a word line perpendicular to the bit lines and drive line, so that when the word line is not selected, the capacitors are completely isolated from any disturb. The bit lines may be complementary and the cell a one-bit cell, or the cell may be a two-bit cell. In the latter case, the memory includes a dummy cell identical to the above cell, in which the two dummy capacitors are complementary. A sense amplifier with three bit line inputs compares the cell bit line with a signal derived from the two dummy bit lines. The logic states of the dummy capacitors alternate in each cycle, preventing imprint and fatigue. The bit lines are partitioned into a plurality of second level bit lines, each connected to a top level bit line via a group select transistor. The memory includes a plurality of such cells, divided into groups, each group connected to one of the second level bit lines. The memory cells are read with a non-destructive read out method that differentiates between the different capacitances of a ferroelectric capacitor in different ferroelectric polarization states.

41 Claims, 12 Drawing Sheets

FERROELECTRIC MEMORY

BACKGROUND OF THE INVENTION

1. Field of the Invention

The present invention relates in general to ferroelectric memories and in particular to such memories that include memory cells including ferroelectric capacitors and arranged in rows and columns to form an array.

2. Statement of the Problem

It is well known that ferroelectric materials are capable of retaining a polarization which can be used to store information in a non-volatile memory. For example, if a strong enough electric field or voltage is placed across a ferroelectric capacitor, when the voltage is removed, a polarization in the direction of the field remains. If the field is then placed across the same capacitor in the opposite direction, the ferroelectric material switches, and when the field is removed, a polarization in the opposite direction remains. Electronic circuits have been designed to associate the polarization in one direction with a digital logic "1" state, and polarization in the opposite direction with a logic "0" state. See, for example, the circuits described in U.S. Pat. No. 2,876,436 issued Mar. 3, 1959 to J. R. Anderson. Like other integrated circuit memories, these circuits include memory cells arranged in rows and columns, each memory cell including at least one switch, a capacitor having a pair of electrodes, and the memory also including plate lines, sometimes referred to as drive lines, connected to one electrode of the capacitor in each cell, and bit lines connected to the other electrode of the capacitor through the switch. In this disclosure, we shall refer to the "plate" line as a "drive" line, as is sometimes done in the art. In the Anderson patent cited above, the switch is a diode. As is known in the art, the switch can be a transistor having a gate, a source and a drain, and the memory includes word lines connected to the control gate of the transistor. See, for example, U.S. Pat. No. 4,873,664 issued Oct. 10, 1989 to S. Sheffield Eaton, Jr. The transistor acts as a switch controlled by its gate to connect the capacitor to the bit line. Information is written into a memory cell by placing either a high or a low voltage on the bit line, turning the transistor on to connect the bit line to the capacitor, and placing a predetermined voltage between the high and low voltage on the drive line. The high voltage causes the memory cell to assume one polarization state, and the low voltage causes the memory cell to assume the opposite polarization state. The memory cell is read by creating a voltage difference between the bit line and drive line, and connecting the bit line to the capacitor via the transistor. If the ferroelectric state changes due to the applied voltage, the bit line will assume a first voltage, and if the ferroelectric state does not switch, then the bit line will assume a second voltage. The bit line voltage is compared to a reference voltage that is about half-way between the first and second voltages; if the bit line voltage is below the reference voltage, a sense amp drives an output low, and if the bit line voltage is above the reference voltage, a sense amp drives an output high. In this way, the state of the ferroelectric capacitor prior to reading determines the output state when the cell is read.

In the above-described memory and other similar conventional ferroelectric memories, the drive line is pulsed. The drive line, being relatively long and connected to the electrodes of many capacitors, has a high capacitance. Thus, it takes a relatively long time for the voltage to rise to its full value, with the result that the time to read and write to the memory is long. To speed up the read and write processes, ferroelectric memories in which the drive line is not pulsed have been developed. See Hiroki Koike et al., "A 60-ns 1-Mb Nonvolatile Ferroelectric Memory With A Nondriven Cell Plate Line Write/Read Scheme, *IEEE Journal of Solid State Circuits*, Vol. 31, No. 11, November 1996. Another solution has been to make the drive line parallel to the bit line, so that only one capacitor at a time is pulsed. See the embodiment of FIG. 6 in the Eaton, Jr. patent mentioned above. Segmented drive lines have also been proposed to speed up the drive line cycle and reduce power. See U.S. Pat. No. 5,598,366 issued Jan. 28, 1997 to Kraus et al. However, all these memories have not been successful due to significant disturb problems. "Disturb" is a problematic feature of most prior art ferroelectric memories in which "disturb" voltages, usually small in amplitude, are unavoidably applied to non-accessed memory cells, which voltages can change the memory state and thus lead to erroneous readings. For example, in the Koike et al. reference, it is explained that leakage from the bit line and drive line to the nodes of a capacitor that is not accessed can destroy the data. This problem is overcome with a compensation scheme which adds complexity to the memory and slows it down. Thus, the disturb problem has either resulted in memories that have been made more complex and slower to overcome the disturb, as in the Koike et al. reference, or simply have resulted in the design being too unreliable to be successful, such as the Eaton, Jr. patent. Moreover, the average power requirements of such cells remains quite high.

Up until recently, all ferroelectric materials tended to fatigue overtime, and the switching charge decreased to a point where the cell could no longer be read. About ten years ago, a class of materials, called layered superlattice compounds herein, had been discovered that do not fatigue. However, while the switching charge remains relatively stable in these materials, the materials still age, i.e., the magnitude of the first and second voltages generally depends on the history of the memory cell. For example, depending on the history, both the first and second voltages in one reading on a specific cell will differ by some voltage factor from the first and second voltages of a later reading of the same cell; or the hysteresis curve may drift overtime in the order of milliseconds due to redistribution of charge within the capacitor. Thus, while the reference voltage will be between the first and second voltages for one reading, in a later reading both the first and second voltages may be above the reference voltage. This generally results in a misreading of the memory cell. Thus, these memories are not "safe" in that the reading or sensing of the data is relatively unreliable.

A typical solution to the above problems is disclosed in U.S. Pat. No. 4,888,733 issued Dec. 19, 1989 to Kenneth J. Mobley. The memory disclosed in the Mobley patent isolates the ferroelectric capacitor with two transistors, which avoids the disturb problem. It also pulses the ferroelectric capacitor in one direction and stores the developed charge on a first temporary storage capacitor, pulses the ferroelectric capacitor in the opposite direction and stores the developed charge on a second temporary storage capacitor, and then compares the stored charges on the two storage capacitors. Thus, this memory essentially compares two states of the same capacitor taken one after another in a time interval that is too short for aging or other changes to take place, which avoids the aging problem. However, this solution triples the length of time it takes to read a memory; thus, this memory is not competitive with state-of-the-art memories which require fast read times. Further, the extra temporary storage capacitors are linear capacitors, which take up significant additional room in the memory, so a memory according to the Mobley design is relatively bulky and is not competitive in a memory market where memory chips are increasingly dense. There are many other multi-capacitor/multi-transistor ferroelectric memories that have been proposed to solve the above problems, some of which have been incorporated into commercial products. All of them are both several times more dense and slower than conventional DRAMs.

The above problems, particularly the aging problem and the "disturb" problem, are most severe in the fastest and densest memory architectures. Thus, commercial applications of ferroelectric memories up to now have been limited to relatively slow and bulky architectures, such as the Mobley design. It would be highly desirable to have a ferroelectric memory architecture that was faster and less bulky than the Mobley design, yet was not subject to the problem of disturb. Such a memory design that also avoided the aging problem would be a significant advance in the art.

SOLUTION

The invention solves the above problems, as well as other problems of the prior art, by providing a ferroelectric memory in which each memory cell can be individually selected without electrically connecting it to any other memory cell, thus eliminating any possibility of disturb.

The invention also provides a method of reading a ferroelectric memory cell which senses the capacitance difference between memory cells in different logic states.

The invention also provides a memory cell in which the ferroelectric elements are capacitors, which memory cell can be read without switching the ferroelectric capacitors.

The invention also provides a novel bit line driver for a ferroelectric memory which drives the bit line to a voltage of a volt or less, and preferably less than half a volt.

The invention also provides a novel sense amplifier for use in a ferroelectric memory, which sense amplifier includes three bit line inputs, two of which are inputs from dummy bit lines.

The invention also provides a method of operating a ferroelectric memory having a pair of dummy cells in which the logic states of the dummy cells are alternated, which avoids imprinting the dummy cells.

The invention also provides a ferroelectric memory in which the bit lines are partitioned.

The invention provides a ferroelectric, non-volatile memory comprising: a plurality of pairs of parallel bit lines and a plurality of memory cells, each memory cell associated with one of the pairs of bit lines, each memory cell comprising: a first ferroelectric capacitor having a first electrode and a second electrode, a second ferroelectric capacitor having a first electrode and a second electrode, a first transistor having a gate, and a second transistor having a gate; wherein in each memory cell the first transistor is connected between the first electrode of the first capacitor and one of the bit lines in the associated bit line pair, the second transistor is connected between the first electrode of the second capacitor and the other of the bit lines in the associated bit line pair; the memory further including a plurality of drive lines and a drive line transistor associated with each of the drive lines, the drive line transistor including a gate, the drive lines being parallel to the bit lines, each of the drive lines connected to the second electrode of at least one of the capacitors in at least one of the memory cells via the drive line transistor, each of the drive lines connected to two or less of the memory cells; the memory further including a word line perpendicular to the bit line pairs and the drive lines, and the gates of the first transistor, the second transistor and the drive line transistor connected to the word line. Preferably, each of the drive lines is connected to the second electrode of the first capacitor and the second electrode of the second capacitor in only one of the memory cells. Preferably, there is one of the drive lines associated with each of the cells, and the drive line is located between the bit lines in the bit line pair associated with the cell with which the drive line is associated. Preferably, each of the drive lines is connected to the second electrode of the first capacitor and the second electrode of the second capacitor in two of the memory cells. Preferably, the bit lines are complementary and each of the memory cells is a one-bit memory cell. Preferably, one of the two memory cells is a two-bit memory cell and the other of the two memory cells is a one-bit memory cell including a dummy capacitor, and the bit line connected to the dummy capacitor is a dummy bit line. Preferably, the bit lines are top level bit lines and there are a plurality of the memory cells divided into a first group and a second group, the memory further including a first group select transistor having a gate, a second group select transistor having a gate, a first group select line, a second group select line, a first second level bit line, and a second second level bit line, and wherein the first group select transistor is connected between the top level bit line and the first second level bit line, the second group select transistor is connected between the top level bit line and the second second level bit line, the first group select line is connected to the gate of the first group select transistor, and the second group select line is connected to the gate of the second group select transistor. Preferably, the memory further includes a bit line driver circuit for driving the bit line to a voltage that is one-third or less of the high voltage of the memory. Preferably, each of the memory cells is a two-bit memory cell. Preferably, one of the pairs of bit lines are dummy bit lines, the memory cell associated with the dummy bit line pair is a dummy cell, and the drive line connected to the dummy cell is a dummy drive line. Preferably, the dummy bit lines are complementary. Preferably, during a first memory cycle, the logic state of the first capacitor in the dummy cell is a logic "0" and the logic state of the second capacitor in the dummy cell is a logic "1", and during a second memory cycle the logic state of the first capacitor in the dummy cell is a logic "1" and the logic state of the second capacitor in the dummy cell is a logic "0". Preferably, the memory further includes a sense amplifier having three-bit line inputs, two of the inputs connected to the pair of dummy bit lines. Preferably, there are two of the drive lines and two of the drive line transistors associated with each of the cells, one of the two drive lines connected to the second electrode of the first capacitor via a first one of the two drive line transistors and the other of the two drive lines connected to the second electrode of the second capacitor via a second one of the two drive line transistors. Preferably, the pair of bit lines associated with each of the cells are complementary. Preferably, each of the cells is a two-bit cell. Preferably, one of the cells includes a dummy capacitor. Preferably, the cell that includes a dummy capacitor is a dummy cell having a pair of dummy bit lines connected to a pair of dummy capacitors and a pair of dummy drive lines connected to the pair of dummy capacitors. Preferably, during a first memory cycle, the logic state of the first capacitor in the dummy cell is a logic "0" and the logic state of the second capacitor in the dummy cell is a logic "1", and during a second memory cycle the logic state of the first capacitor in the dummy cell is a logic "1" and the logic state of the second capacitor in the dummy cell is a logic "0". Preferably, there are a plurality of word lines, each of the word lines associated with a different row of memory cells with the gates of each of the transistors in each of the memory cells in a row of memory cells connected to the word line associated with the row; and the memory includes a drive line driver circuit connected, via the drive line, to the first and second capacitors in at least one of the memory cells in each of a plurality of the rows.

In another aspect, the invention provides a ferroelectric, non-volatile memory comprising a pair of complementary bit lines, a drive line located between and parallel to the complementary bit lines, a word line perpendicular to the bit lines and drive line, and a memory cell comprising: a first ferroelectric capacitor, a second ferroelectric capacitor, a first transistor, a second transistor, and a drive line transistor; wherein the first transistor is connected between the first capacitor and one of the complementary bit lines, the second transistor is connected between the second capacitor and the other of the complementary bit lines, and the drive line transistor is connected between at least one of the capacitors and the drive line.

In a further aspect, the invention provides a ferroelectric, non-volatile memory wherein the bit lines and drive lines are partioned. In the embodiment where the bit lines are partioned, there are is hierarchy of bit lines, with each higher hierarchical level connected to a plurality of bit lines at the next lower level via transistors controlled by group select signals. Preferably, there are top level bit lines and there are a plurality of memory cells divided into a first group and a second group, the memory further including a first group select transistor having a gate, a second group select transistor having a gate, a first group select line, a second group select line, a first second level bit line, and a second second level bit line, and wherein the first group select transistor is connected between the top level bit line and the first second level bit line, the second group select transistor is connected between the top level bit line and the second second level bit line, the first group select line is connected to the gate of the first group select transistor, and the second group select line is connected to the gate of the second group select transistor.

In another aspect, the invention provides a ferroelectric, non-volatile memory comprising: a first bit line; a second bit line parallel to the first bit line; a drive line located between and parallel to the first and the second bit lines; a plurality of memory cells, each memory cell comprising: a first ferroelectric capacitor, a second ferroelectric capacitor, a first transistor, a second transistor, and a third transistor, each having a gate; wherein the first transistor is connected between the first capacitor and the first bit line, the second transistor is connected between the second capacitor and the second bit line, and the third transistor is connected between the capacitors and the drive line; a plurality of word lines, each of the word lines associated with a different row of memory cells with the gates of each of the transistors in each of the memory cells in a row of memory cells connected to the word line associated with the row; and a drive line driver circuit connected, via the drive line, to the first and second capacitors in at least one of the memory cells in each of a plurality of the rows.

In still another aspect, the invention provides a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric element, the polarization of the ferroelectric element corresponding to the data stored therein, the memory also including a signal generator providing a read signal, the improvement wherein the memory further comprises a bit line driver circuit responsive to the read signal for driving the bit line to a voltage of no more than one volt.

In still another aspect, the invention provides a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric element, the polarization of the ferroelectric element corresponding to the data stored therein, the memory also including a signal generator providing a read signal, the improvement wherein two of the bit lines are complementary dummy bit lines and one of the bit lines is not a dummy bit line; the memory further comprises: a sense amplifier having a first bit line input connectable to the bit line that is not a dummy bit line, a second bit line input connectable to a first one of the dummy bit lines, and a third bit line input connectable to a second one of the dummy bit lines.

In yet another aspect, the invention provides a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric element, the polarization of the ferroelectric element corresponding to the data stored therein, the improvement wherein the bit lines are top level bit lines and there are a plurality of memory cells divided into a first group and a second group; the memory further including a first group select transistor having a gate, a second group select transistor having a gate, a first group select line, a second group select line, a first second level bit line, and a second second level bit line, and wherein the first group select transistor is connected between the top level bit line and the first second level bit line, the second group select transistor is connected between the top level bit line and the second second level bit line, the first group select line is connected to the gate of the first group select transistor, and the second group select line is connected to the gate of the second group select transistor.

The invention also provides a method of operating a ferroelectric, non-volatile memory comprising a plurality of memory cells, each memory cell including a memory cell ferroelectric element, the method comprising: electrically isolating each of the memory cell ferroelectric elements from all other memory cell ferroelectric elements. Preferably, the memory cell ferroelectric element is a ferroelectric capacitor.

In another aspect, the invention provides a method of operating a ferroelectric, non-volatile memory of the type having a plurality of memory cells arranged in rows and columns, each column comprising a bit line pair coupled to memory cells along the column, each row comprising a word line coupled to cells along the row, the memory also including a plurality of drive lines distinct from the bit and word lines, each memory cell coupled to a corresponding drive line, each memory cell comprising a pair of ferroelectric memory elements, the polarization of each of the ferroelectric memory elements corresponding to the data stored therein; the method comprising: electrically isolating each of the ferroelectric memory element pairs from all other ferroelectric memory element pairs. Preferably, each of the drive lines is coupled to the memory cells along a column and each of the memory cells in said column includes a plurality of transistors, a first one of the transistors connected between a first one of the ferroelectric capacitors and a first one of the bit lines in the bit line pair associated with said column, a second one of the transistors connected between a second one of the ferroelectric capacitors and a second one of the bit lines in the bit line pair associated with said column, and a third one of the transistors connected between at least one of the ferroelectric capacitors and the drive line associated with the column, and electrically isolating comprises keeping the first, second and third transistors associated with each memory cell in said column off except when the associated memory cell is selected to be addressed, and selecting only one memory cell in the column at a time. Preferably, the third transistor is connected between the first ferroelectric capacitor and a first associated drive line and each of the memory cells includes a fourth transistor connected between the second ferroelectric capacitor and a second associated drive line, and the keeping comprises keeping the fourth transistor in the column off except when the associated memory cell is selected to be addressed. Preferably, the isolating includes writing to one of the memory cells while maintaining the isolation. Preferably, the writing comprises writing a first predetermined logic state during a first time period and writing a second predetermined logic state during a second time period. Preferably, the writing comprises writing a first predetermined logic state to both of the ferroelectric memory elements in one of the pairs of elements and then writing a second predetermined logic state to any of the ferroelectric elements in the pair for which the data applied to the memory requires that it be in a state other than the first predetermined state. Preferably, the isolating includes reading one of the memory cells while maintaining the isolation. Preferably, the reading comprises a destructive read out method. Preferably, the reading comprises a non-destructive read out method.

In a further aspect, the invention provides a method of operating a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a pair of ferroelectric memory elements, the polarization of each of the ferroelectric memory elements corresponding to the data stored therein; the method comprising: electrically isolating each of the ferroelectric memory element pairs from all other ferroelectric memory element pairs; applying a single read pulse to a memory cell; and sensing the logic state of the memory cell after the single read pulse. Preferably, the method further comprises applying a rewrite pulse to the memory cell.

In another aspect, the invention provides a method of operating a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric memory element, the polarization of the ferroelectric memory element corresponding to the data stored therein, the method comprising: applying a read pulse voltage of no more than one volt to a memory cell; and sensing the logic state of the memory cell after the read pulse. Preferably, the read pulse is one-half volt or less.

In still a further aspect, the invention provides a method of reading a ferroelectric, non-volatile memory of the type having at least twenty-five memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric memory element, the polarization of the ferroelectric memory element corresponding to the data stored therein, the method comprising: reading one of the memory cells connected to a selected drive line; and electrically connecting no more than four of the ferroelectric memory elements to the selected drive lines during the step of reading.

In yet another aspect, the invention provides a method of reading a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric memory element, the capacitance state of the ferroelectric memory element corresponding to the data stored therein, the method comprising: electrically connecting a selected memory cell to a selected bit line; and providing a data output signal corresponding to the capacitance state of the ferroelectric memory element.

In still another aspect, the invention provides a method of reading a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric memory element, the polarization of the ferroelectric memory element corresponding to the data stored therein, the method comprising: electrically connecting a selected memory cell to a selected bit line; applying an electrical charge to the bit line; without switching the ferroelectric memory element of the selected cell, absorbing in the element an amount of the charge dependent on the polarization state of the ferroelectric memory element; and sensing the voltage on the selected bit line and providing a data output signal corresponding to the polarization state of the ferroelectric memory element.

In yet another aspect, the invention provides a method of reading a ferroelectric, non-volatile memory of the type having a plurality of memory cells arranged in rows and columns, each column comprising a bit line coupled to memory cells along the column, each row comprising a word line coupled to cells along the row, the memory also including a plurality of drive lines distinct from the bit and word lines, each memory cell coupled to a corresponding drive line, each memory cell comprising a ferroelectric capacitor, the polarization of the ferroelectric memory element corresponding to the data stored therein, the method comprising: selecting one of the ferroelectric memory cells; and reading the capacitor in the selected memory cell without changing the ferroelectric polarization state of the capacitor. Preferably, the step of reading comprises sensing the capacitance of the ferroelectric capacitor.

The invention also provides, in a further aspect, a method of operating a ferroelectric, non-volatile memory of the type having a plurality of memory cells arranged in rows and columns, each column comprising a bit line coupled to memory cells along the column, the bit lines including a first dummy bit line connected to a first dummy memory cell, each row comprising a word line coupled to cells along the row, the memory also including a plurality of drive lines distinct from the bit and word lines, each memory cell coupled to a corresponding drive line, each memory cell comprising a ferroelectric memory element, the polarization of the ferroelectric memory element corresponding to the data stored therein, the method comprising writing a first logic state to the first dummy memory cell in a first memory cycle and writing a second logic state to the first dummy memory cell in a second memory cycle.

In yet another aspect, the invention provides a method of selecting a memory cell in a ferroelectric, non-volatile memory having a plurality of memory arrays, each memory array having a plurality of memory cells arranged in rows and columns; selecting one of the plurality of arrays; and selecting a memory cell in the selected array. Preferably, the selecting comprises selecting a pair of memory cells while electrically isolating the selected memory cells from all other memory cells in the memory. Preferably, the selecting comprises selecting a single memory cell while electrically isolating the selected memory cell from all other memory cells in the memory.

In still a further aspect, the invention provides a method of writing to a ferroelectric, non-volatile memory, the method comprising: selecting a single memory cell used in complementary mode in the memory; and writing data to the selected memory cell without electrically connecting it to any non-selected memory cell in the memory.

In still another aspect, the invention provides a method of writing to a ferroelectric, non-volatile memory, the method comprising: selecting a single memory cell in the memory; and writing data to the selected memory cell without electrically connecting it to any non-selected memory cell in the memory.

In yet a further aspect, the invention provides a method of reading a ferroelectric, non-volatile memory, the method comprising: selecting a single memory cell used in complementary mode in the memory; and reading the selected memory cell without electrically connecting to any non-selected memory cell in the memory.

In yet another aspect, the invention provides a method of reading a ferroelectric, non-volatile memory, the method comprising: selecting a single memory cell in the memory; and writing data to the selected memory cell without electrically connecting it to any non-selected memory cell in the memory.

The invention for the first time provides a ferroelectric, non-volatile memory which is competitive with DRAMs and SRAMs with respect to speed, reliability, and density. Numerous other features, objects and advantages of the invention will become apparent from the following description when read in conjunction with the accompanying drawings.

DETAILED DESCRIPTION OF THE PREFERRED EMBODIMENT

Figure 2:
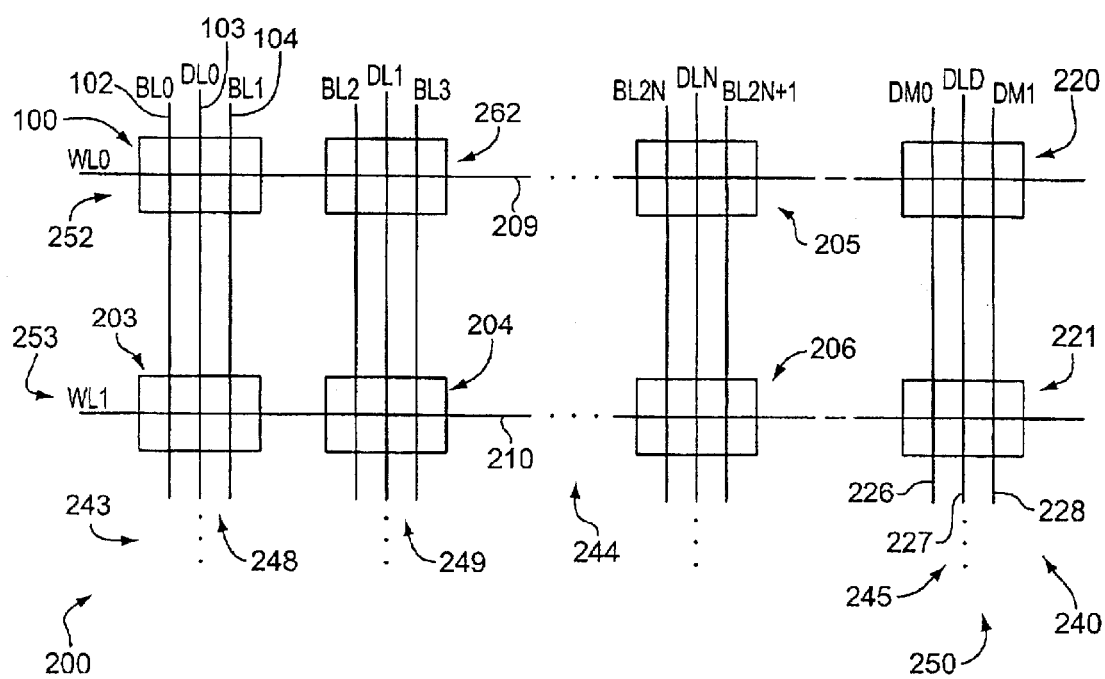
FIG. 2 is a circuit diagram illustrating two embodiments of a memory cell array according to the invention.
Figure 3:
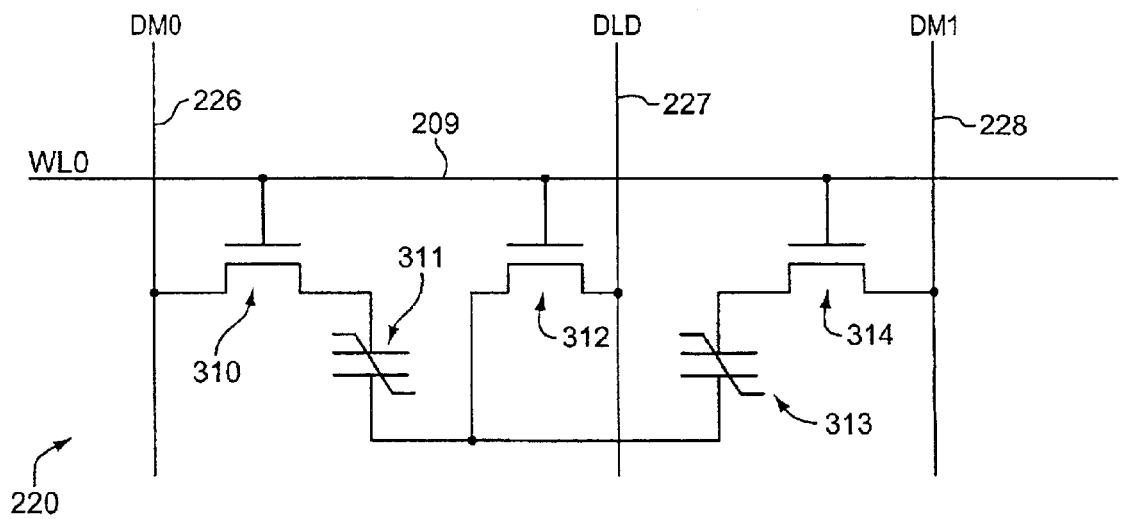
FIG. 3 is an electrical circuit diagram showing in detail a dummy memory cell according to the invention.
Figure 4:
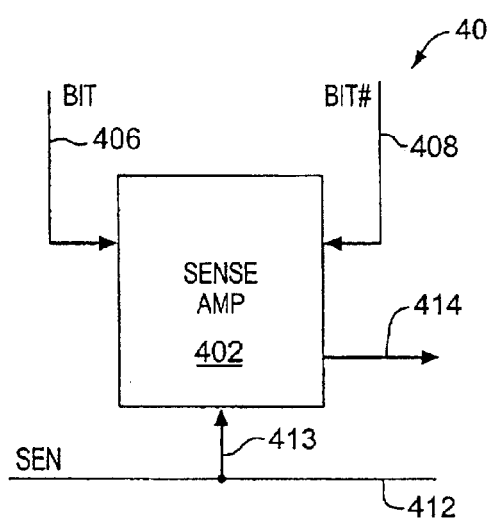
FIG. 4 is a circuit diagram showing the connections to the sense amplifier in one preferred embodiment of the invention.
Figure 5:
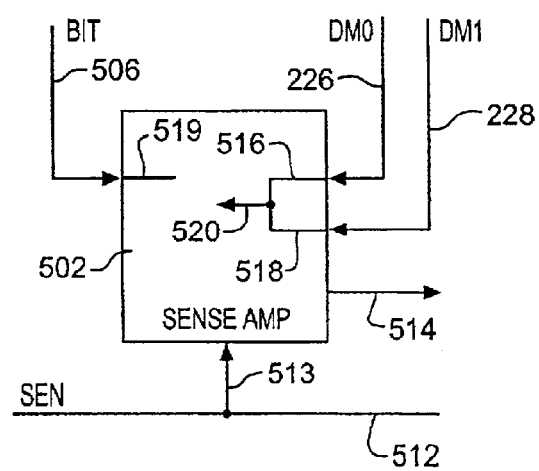
FIG. 5 is a circuit diagram showing the connections to the sense amplifier in another preferred embodiment of the invention.
Figure 6:
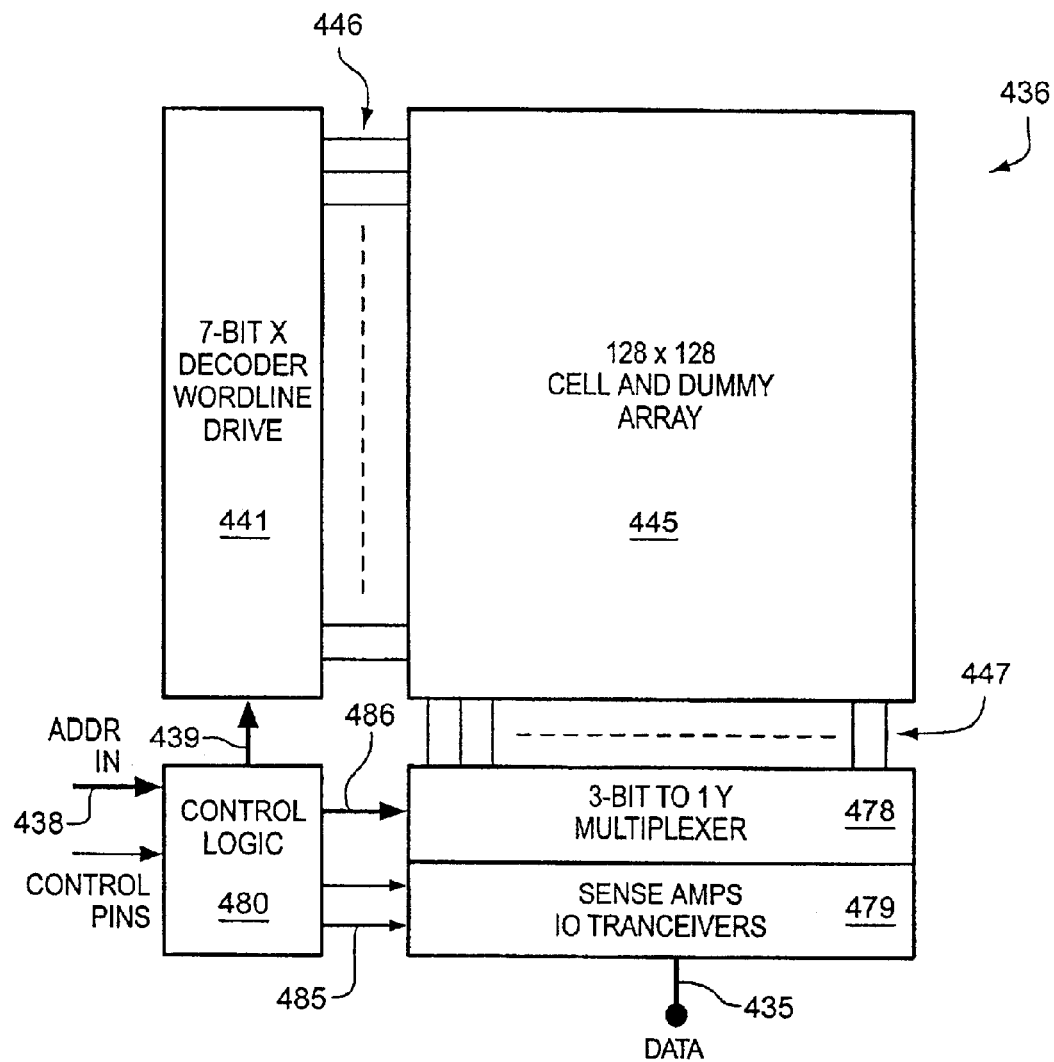
FIG. 6 shows an exemplary embodiment of a memory in which the invention is incorporated.

Briefly directing attention to FIG. 6, a memory 436 according to the invention is shown. A memory address is applied on inputs 438, decoded in Control Logic 480, Decoder 441 and Multiplexer 478 to address a particular memory cell in array 445 as indicated in the address. Signals corresponding to incoming data on line 435 are applied to the addressed cell via I/O Transceiver 479 and Multiplexer 478 to write to the cell, and Sense Amplifier and I/O Transceiver 479 senses output data from the addressed cell and outputs it on line 435. Signal generator 480 generates certain timing signals to operate the memory and applies them to Decoder 441, Sense Amplifier and I/O Transceiver 479 and Multiplexer 478. The invention relates to novel structures of memory cells and dummy cells in array 445 as shown in FIGS. 1–3, 7 and 8, sense amplifier structures as shown in FIGS. 4 and 5, a bit line driver shown in FIG. 17, and an array structure shown in FIG. 20, which individually and in combination result in a dense, fast, reliable, and energy-efficient memory, as well as methods of operating and fabricating these structures and the memory in which they are incorporated, some of which methods are illustrated in FIGS. 9–16, 18 and 19.

Herein, a "voltage line" generally corresponds to a bit line, a word line, a drive line or other voltage source, or voltage sink; the term "trinion cell" generally corresponds to a memory cell having three transistors and two capacitors, or otherwise stated, a 3T/2C cell configuration. Herein, the term "source/drain" path, as applied to a transistor, refers to the conductive path through a field effect transistor (FET), other type of transistor, or other switching device which path may be either conductive or non-conductive depending upon the state of a gate or other switching device control mechanism. Herein, when discussing direction in the context of a cross-sectional view of a wafer, the silicon layer is generally at the "bottom" and a metal layer generally at the "top" of such diagrams. Thus, a reference to a first component being placed "above" a second component generally corresponds to the second component being closer to the silicon layer than the first component. Accordingly, the "upward" direction corresponds to a direction which leads from the silicon layer toward the metal layer.

Figure 1:
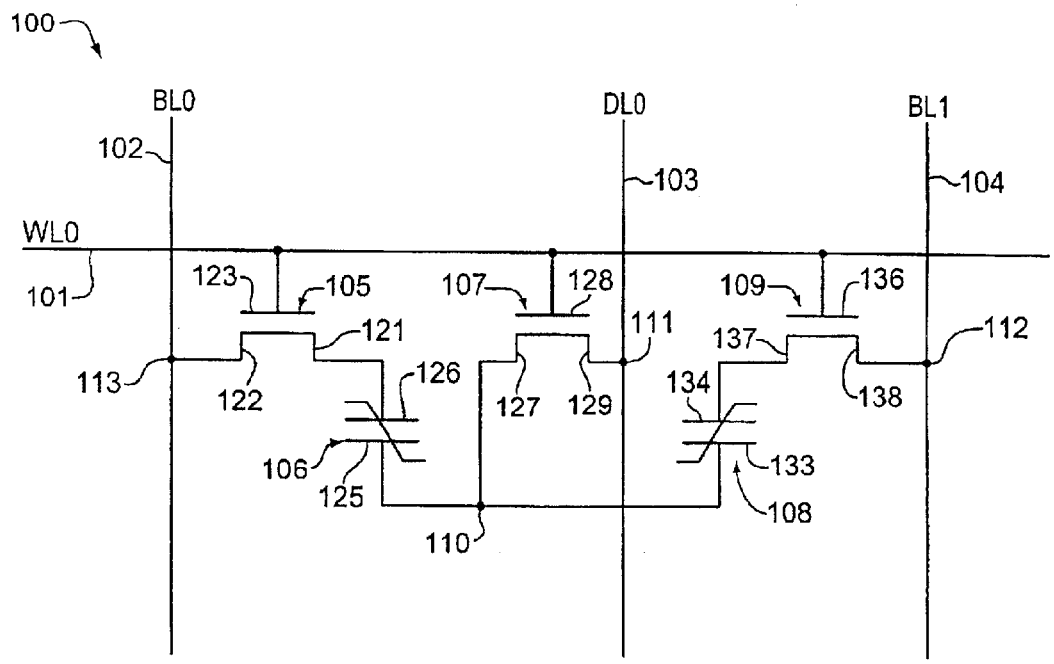
FIG. 1 is an electrical circuit diagram of a memory cell having three transistors and two capacitors according to a preferred embodiment of the present invention.

FIG. 1 is an electrical circuit diagram of a memory cell 100 according to a preferred embodiment of the present invention. Memory cell 100 includes a first ferroelectric capacitor 106, a second ferroelectric capacitor 108, and transistors 105, 107, and 109. Cell 100 is connected within an array 445 (FIG. 6) via word line 101, a bit line pair comprising bit lines 102 and 104, and drive line 103. The gates 123, 128, and 136 of transistors 105, 107 and 109, respectively, are connected to word line 101. One source/drain of transistor 105 is connected to bit line 102 at node 113, and the other source/drain of transistor 105 is connected to lower electrode 126 of capacitor 106. The upper electrode 125 of capacitor 106 is connected to node 110, which is also connected to one source/drain 127 of transistor 107 and the upper electrode 133 of capacitor 108. The other source/drain 129 of transistor 107 is connected to drive line 103 at node 111. The lower electrode 134 of capacitor 108 is connected to one source/drain of transistor 109, and the other source/drain 138 of transistor 109 is connected to bit line 104 at node 112. We shall refer to transistor 107 as the "drive line transistor". In this disclosure, this transistor is part of cell 100.

One distinctive aspect of the preferred embodiment memory cell 100 of FIG. 1 is that bit lines 102 and 104 run parallel to drive line 103, and all of the foregoing are arranged perpendicularly to word line 101. This arrangement preferably enables individual cells to be selected by activating a combination of a word line and a drive line uniquely associated with a particular cell. Such selectivity reduces the power requirement associated with activating an entire column or row of cells when only one cell is of interest. Moreover, selecting only a single cell in this manner prevents undesired disturb voltages from reaching non-selected cells. The foregoing is desirable because such disturb voltages may, over time, cause undesired changes in the polarization of the non-selected memory cells. It will be appreciated that alternative relative orientations of the word lines, bit lines, and drive lines may be employed while employing the inventive technology disclosed herein, and all such variations are included within the scope of the present invention.

In a preferred embodiment, the trinion cell depicted in FIG. 1 includes two ferroelectric capacitors and three transistors. The three transistors, identified by reference characters 105, 107, and 109, are preferably N-channel transistors, but may alternatively be P-channel transistors, P and N transmission gates, bipolar transistors, other current switching devices, or a mixture of the available transistors. Ferroelectric capacitors 106 and 108 may include one or more of a range of ferroelectric materials, including but not limited to PZT (lead zirconate titanate) and layered superlattice materials. Layered superlattice materials are discussed in commonly assigned U.S. Pat. No. 5,519,234, issued May 21, 1996 to Araujo et al., entitled "Ferroelectric Dielectric Memory Cell Can Switch At Least Giga Cycles And Has Low Fatigue—Has High Dielectric Constant And Low Leakage Current," the disclosure of which is hereby incorporated herein by reference.

An advantage of a preferred embodiment of the trinion cell is that both the upper and lower electrodes of both capacitors 106 and 108 are isolated from their respective bit lines and/or drive lines by at least one transistor, thereby affording superior electrical isolation when these transistors are switched off than that available in the prior art. In a preferred embodiment, the transistors which operate to selectively isolate capacitors 106 and 108 from their respective bit line and drive line connections are coupled to a single word line 101. In this manner, turning off word line 101 preferably operates to turn off all three transistors 105, 107, and 109, thereby fully isolating both electrodes of both capacitors 106 and 108 from voltage disturbance from bit lines 102 and 104 and drive line 103 and from noise due to potential noise sources connected to these voltage lines. Although the above discussion is directed to a circuit having a configuration enabling full isolation of capacitors from all noise sources by switching a single word line, it will be appreciated that alternative embodiments may employ more than one word line in order to achieve the desired capacitor electrical isolation, and all such variations are intended to be included within the scope of the present invention.

In one embodiment of the present invention, the 3T/2C cell, or trinion cell, may be employed to store a single data bit by storing complementary data on bit lines 102 and 104. Herein, this approach is referred to as the one-bit storage mode. Alternatively, two data bits may be stored in the inventive memory cell by storing independent data on bit lines 102 and 104. The two-bit data storage option is discussed at greater length below. Herein, this second approach is referred to as the two-bit storage mode.

Where the 3T/2C memory cell is employed in the one-bit storage mode, a high level of noise immunity is preferably provided. Moreover, the use of a common drive line or DL line 103 in contact with the upper electrodes of the two capacitors 106 and 108 preferably provides well-balanced voltage pulses to the two capacitors 106, 108, thereby beneficially minimizing mismatches in voltage and current conditions at the upper electrodes of the two capacitors.

In a preferred embodiment, the deployment of a common drive line 103 for the two separate capacitors 106, 108 in combination with the deployment of transistor 107, which is disposed between drive line 103 and the upper electrodes of capacitors 106, 108, operates to reduce capacitive loading on drive line 103. It may be seen that when word line 101 is powered down, transistor 107 will effect an open circuit between drive line 103 and the upper electrodes of capacitors 106 and 108, thereby preventing capacitors 106 and 108 from capacitively loading drive line 103. This reduction in capacitive loading preferably operates to enable drive line 103 to be switched in less time and employing less energy than when capacitive loading is present. Moreover, appropriate switching of transistor 107 under control of word line 101 preferably operates to prevent disturbance or "disturb" voltages along drive line 103 from affecting the upper electrodes of capacitors 106 and 108.

In addition to the electrical isolation benefits discussed above, the placement of drive line 103 between bit lines 102 and 104 in a preferred embodiment of the inventive memory cell preferably operates to equalize mutual capacitive coupling between the two bit lines 102 and 104.

As previously mentioned, the 3T/2C or trinion cell may also be used in a two-bit storage mode. In this case, bit lines 102 and 104 preferably contain independent data bits. Operating in this mode, the inventive memory cell would provide a data storage density, measured in storage bits divided by the number of transistors per cell, substantially superior to that available in the prior art. Specifically, in the two-bit storage mode of the present invention, two data bits may be stored in a cell having three transistors. In contrast, only one bit is generally stored in a traditional 2T/2C memory cell. Thus, a preferred embodiment memory cell of the present invention stores 1 bit per 1.5 transistors, whereas the prior art 2T/2C memory cell stores 1 bit per 2.0 transistors. This increase in data storage density preferably operates to enable still further size reduction of memory circuits employing the inventive technology disclosed herein.

In a preferred embodiment, the deployment of a common drive line 103 between bit lines 102 and 104 generates balanced electrical impulses to the upper electrodes of capacitors 106 and 108. This electrical balance preferably operates to reduce signal mismatch and to enhance the operation of sense amplifiers (FIGS. 5 and 6) used with dummy reference cells (FIGS. 2 and 3). As with the one-bit storage case, the use of common drive line 103 in conjunction with transistor 107 preferably operates to reduce capacitive loading on drive line 103.

FIG. 2 illustrates a memory array 200, 240 according to a preferred embodiment of the present invention. FIG. 2 illustrates both an array 200 according to the one-bit storage mode embodiment, and an array 240 according to the two-bit storage mode embodiment. Array 200 includes a plurality of columns 252, 253, etc, and a plurality of rows 248, 249, etc., or memory cells, with a total of (N+1)×M cells where N+1 is the number of columns in array 200, and M is the number of rows in the array. The dotted lines 243 represent additional rows required to complete the array, and the dotted lines 244 indicate the additional columns to compete the array. Array 200 includes 100, and 202–206 as well as cells indicated by the dotted lines 243 and 244. Array 240 includes all the cells in array 200 plus a column 250 of dummy cells, including dummy cells 220, 221, and the additional cells indicated by dotted line 245. Preferably, the placement of common drive line 227 between bit lines 226 and 228 operates to reduce mutual capacitive coupling between the bit lines.

An exemplary dummy cell is shown in FIG. 3. This cell has the same structure as memory cell 100 of FIG. 1, including three transistors 310, 312, and 314, two ferroelectric capacitors 311 and 313, which are connected as described above, and which are connected into array 240 by word line 209, dummy bit lines 226 and 228, and dummy drive line 227, as described above for the corresponding elements of FIG. 1. The fact that there are two dummy bit lines 226 and 228 and two dummy ferroelectric capacitors 311 and 313 is an important feature of the invention. Dummy cell 220 operates in complementary mode: the ferroelectric states stored in capacitors 311 and 313, as well as the signals applied to bit lines 226 and 228, are complementary. That is, when the state of capacitor 311 is a logic "1", the state of capacitor 313 is a logic "0", and vice versa.

Returning to FIG. 2, it will be appreciated that the components and electrical connections of each of cells 100, 202–206, as well as the other cells of array 200 not explicitly shown, generally correspond to those of memory cell 100 depicted in FIG. 1, while the components and circuitry of each of the dummy cells in row 250 generally correspond to that of dummy cell 220 shown in FIG. 3. However, for the sake of simplicity, the internal detail of each of the cells is omitted in FIG. 2.

In a preferred embodiment, word lines 209, 210 and the other word lines extend through arrays 200 and 240, each word line corresponding to a row of cells. Similarly, bit lines 102 and 104, and drive line 103, as well as the other bit and drive lines, extend through array 200 and, in the one-bit embodiment in which the bit lines are complementary, each complementary pair of bit lines and the corresponding drive line correspond to a column of cells.

In a preferred embodiment, for a cell to be selected, the word line and drive line coinciding at this cell would both have to be activated. For example, where word line 210 and drive line 103 are both active, cell 203 is activated. With the stated combination of active drive and word lines, cell 100 would preferably have an active drive line, but the absence of an active word line would prevent any voltage from reaching the electrodes of the capacitors in cell 100. In cell 204, the word line would be active, thus coupling the upper electrodes of the capacitors to drive line 207. However, drive line 207 would not be active, thereby preventing any disturbance of the polarization of the capacitors of cell 204.

In the prior art, the existence of disturb voltages would have prevented the use of multiple dummy lines because of the destructive effect of disturb voltages which would be present at one or more of the electrodes of a capacitor. However, in a preferred embodiment of the present invention, the deployment of transistors or other switching devices between both electrodes of the capacitors within each dummy cell and all sources of disturb voltages preferably operates to protect the capacitors against such disturb voltages, thereby enabling greater flexibility and compactness in memory circuit design without disturbing the polarization of the various capacitors in the memory cell.

In the embodiment of FIG. 2, N is an integer and may equal zero. That is, there may be one dummy cell for each active cell. Preferably, N equals 3, 7, 15, or some other multiple of 2N−1. As known in the art, there may be many more rows above and/or below the rows shown, and many more columns, including both additional columns of active cells and additional columns of dummy cells. One advantage of the invention is that many more rows of cells may be used than in prior art memories, without significantly slowing the memory. That is because all cells in a column except the cell being addressed are disconnected from the drive line, and thus their capacitance does not add to the capacitance of the drive line. Since, in prior ferroelectric memories, the capacitance of one memory cell capacitor is of the order of the capacitance of the drive line, when the memory cell according to the invention is combined with any prior art design, the length of the column can be extended by a factor approximately equal to the number of cells in a column of the prior art design. For example, if the prior art design was limited to eight rows, with the cell of the present invention, the design can use 64 rows and still have approximately the same speed.

FIG. 4 illustrates the connection of a sense amplifier 402 into the array of FIG. 2 and the memory of FIG. 6 in the one-bit per cell mode, and FIG. 5 illustrates the connection of a sense amplifier 502 into the array of FIG. 2 and the memory of FIG. 6 in the two-bit embodiment. The design of sense amplifiers, such as 402 and 502, are well-known in the art and thus will not be described in detail except for a feature of sense amplifier 502, namely, how its reference signals on lines 516 and 518 are derived from dummy cell 220, which feature is novel. Bit lines 406 and 408 in FIG. 4 represent a bit line pair, such as bit lines 102 and 104. In this embodiment, the bit lines correspond to opposite logic states. The bit lines are connected to the two sides of sense amplifier 402 as known in the art. A sense amplifier enable signal, SEN, carried by sense enable line 412 is applied to sense amp 402 via input 413. Sense enable line 412 is one of the lines making up signal lines 485 connected to signal generator 480 (FIG. 6). Data is output from sense amplifier 402 on data line 414 which is multiplexed to data output 435 (FIG. 6) as known in the art.

In FIG. 5, bit line 506 corresponds to any of bit lines 102, 104, etc. In this embodiment, sense amplifier 502 includes three bit line inputs, 516, 518, and 519. One bit line input 519 is connected to bit line 506. Bit line input 516 is connected to dummy bit line 226, and bit line input 518 is connected to dummy line 228. Within sense amplifier 502, the signals from the two dummy lines 226 and 228 are combined to yield a single reference signal on reference line 520, which reference signal is halfway between the signal DM0 and DM1. The connection of sense input 513, sense line 512, and data line 514 into memory 436 of FIG. 6 is as just described for the sense amplifier of FIG. 4.

As known in the art, a separate sense amplifier 402 may be connected to each complementary pair of bit lines, or one sense amplifier may be utilized by many pairs of bit lines using transistors operated by signals from signal generator 480 (FIG. 6), via a multiplexer circuit, or in some other manner. Similarly, a separate sense amplifier 502 may be connected between the dummy bit lines and each of the other bit lines, or one sense amplifier may be utilized with a plurality of bit lines.

It is a feature of the invention that the dummy cells, such as 220, are driven such that the capacitors 311 and 314 are in opposite logic states. However, the specific logic states alternate, which may be every cycle, but preferably the states are changed less often, for example, every ten, twenty-five or one hundred cycles, depending on the ferroelectric material. That is, if capacitor 311 is in a logic "0" state and capacitor 314 is in a logic "1" state for one cycle series, in the next series of cycles, capacitor 311 is placed in a logic "1" state and capacitor 314 is placed in a logic "0" state. This prevents the capacitors from imprinting and/or fatiguing, and improves the matching of the dummy cell tremendously.

Figure 20:
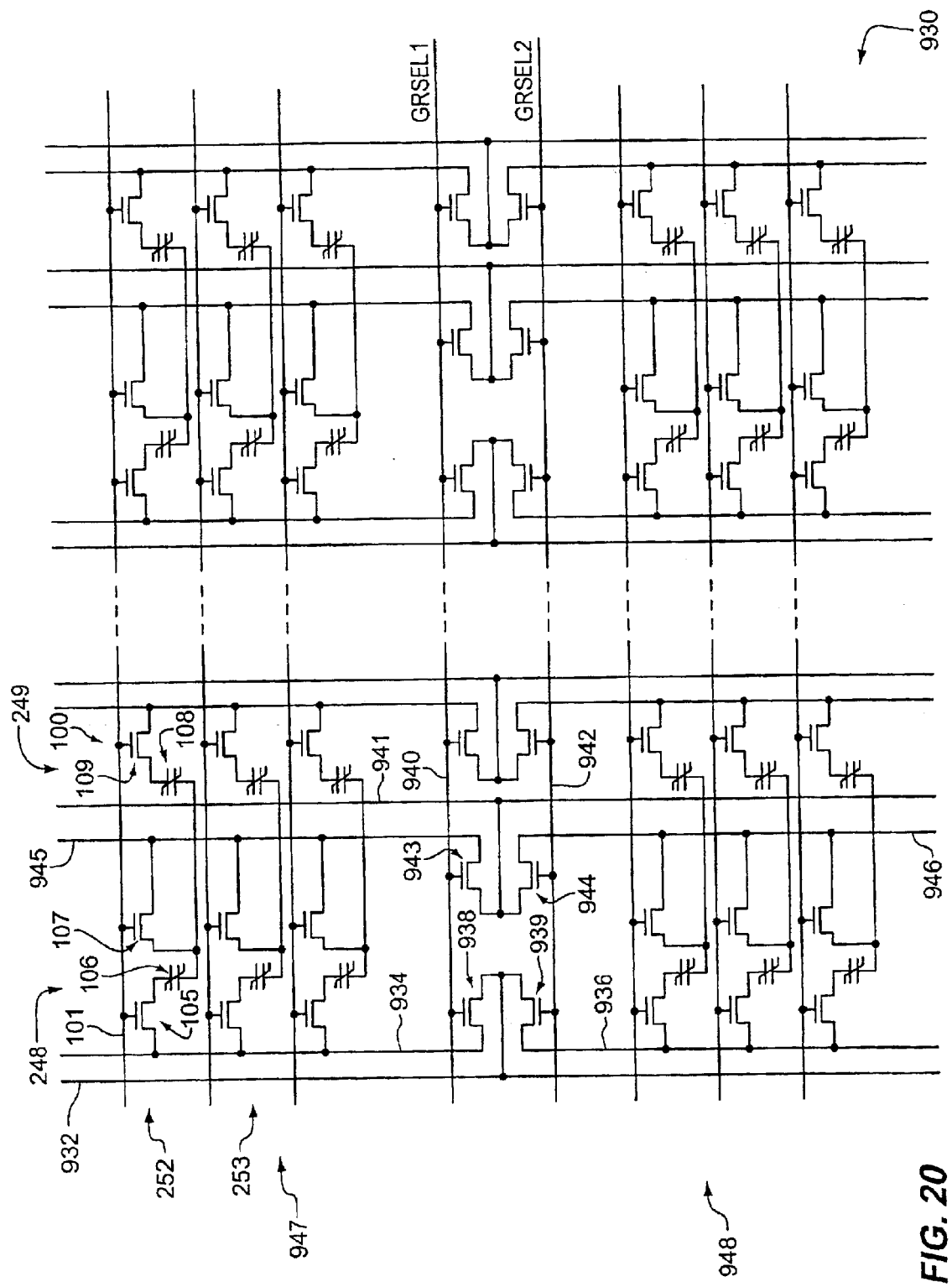
FIG. 20 is a portion of a partioned memory cell array according to a preferred embodiment of the invention.

FIG. 6 is a block diagram illustrating an exemplary integrated circuit memory 436 in which memory portion 100 is a part, and in which memory arrays, such as 200 and 240, according to the invention are utilized. For simplicity, the embodiment shown is for a (1Kword×16 Bit) FeRAM; however, the invention may be utilized in a wide variety of sizes and types of memories, including, but not limited to, those in which the addresses are not multiplexed, such as flash or SRAM type memories. In the 16K embodiment shown, there are seven address input lines 438 which connect through Control Logic section 480 and lines 439 to the X decode section 441. X decoder 441 is connected to a 128×128 memory cell array 445 via 128 lines 446, which comprise the word lines, such as 252 and 253 (FIG. 2), and the group select lines 940 and 942 (FIG. 20). Three other address lines 438 are decoded via Control Logic 480 to generate 8 Y select lines 486 to drive Y multiplexer 478, which drives the bit and drive lines 447, such as 102–104 and 226–228 (FIGS. 2 and 3). Control Logic signal generator 480 is connected to the sense amplifier and data-out multiplexer circuit 479 via lines 485. These lines provide the SEN signal discussed in connection with FIG. 4, the CH and GR SEL signals discussed below in connection with FIGS. 17, 18 and 20, as well as other signals. The number of lines 446, 447, 485 and 486 depends on which embodiment of the invention discussed herein is utilized, as well as the size of the array. DATA bus 435 is a bi-directional sixteen bit bus connected to the sense amplifier and data-out multiplexer 479 and providing a sixteen bit data input into the memory. The embodiment of the memory cell array 445 shown contains 128×128=16,384 memory cells, which is conventionally designated as 16K. These cells are ferroelectric switching capacitor-based cells such as 100.

The operation of the memory in FIG. 6 is as follows. X Decoder signals $A_0$ through $A_6$ and Y Decoder signals $A_7$ through $A_9$ are latched, buffered, and decoded by Control Logic 480 and passed to X decoder 441 and two-way Y multiplexer 478, respectively. X decoder 441 decodes the address signals and places the word line signals, such as the WL0 and WL1 signals discussed above, on one of word lines 446; generally a signal is placed on the word line of the cell that is addressed. As mentioned above, the Sense Amplifiers and I/O Transceiver circuit 479 includes sense amplifiers, such as 402 and 502 (FIGS. 4 and 5) which are located along lines 447 to sense and amplify the signals on the selected lines, and the I/O transceiver in circuit 479 drives and receives data from data line 435.

The various components of memory 436 in FIG. 6 are shown only as an exemplary embodiment to illustrate how the invention is used. However, there are literally hundreds of memory designs in which the invention may be used, and different designs place the various components in different locations, may not use some of the components, or may use other components. For example, in different memory designs, the sense amplifiers are placed at the midpoint of lines 447, at the same end as the line drivers, or some other place in the circuit. In some memories, signal generator 480 and X decoder and word line driver circuit 441 may be combined into a single signal generation unit. The circuitry of the various components of memory 436, except as discussed elsewhere herein, is known in the art of integrated circuit memory design, and will not be further discussed herein. Other logic required or useful to carry out the functions outlined above, as well as other known memory functions, is also included in memory 436 but is not shown or discussed, as it is not directly applicable to the invention.

Figure 7:
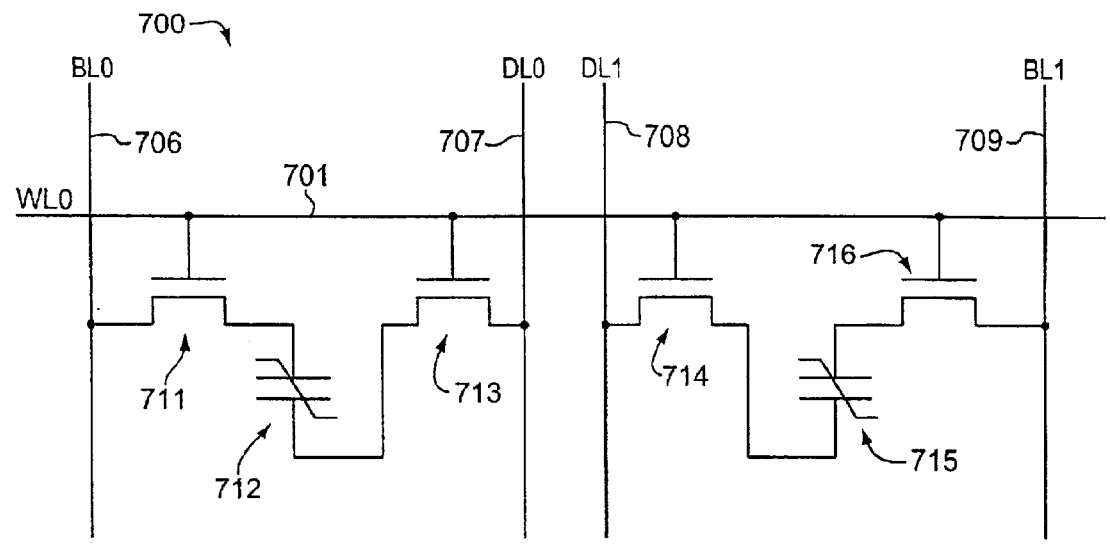
FIG. 7 is an electrical circuit diagram of an alternative preferred embodiment of a memory cell according to the invention.

FIG. 7 is an electrical schematic diagram of an alternative memory cell 700 according to the invention. This structure includes four transistors 711, 713, 714, and 716 and two ferroelectric capacitors 712 and 715. Transistors 711, 713 and capacitor 712 are connected to bit line 706 and drive line 707 in the same way as transistors 105 and 107 and capacitor 106 are connected to word line 101, bit line 102 and drive line 103 (FIG. 1), and transistors 714 and 716 and capacitor 715 are connected to word line 701, bit line 709, and drive line 708 in the same was as transistors 107 and 109 and capacitor 108 are connected to word line 101, bit line 104, and drive line 103. The only difference is that there are two drive lines 707 and 708 instead of one. Again, cell 700 can be programmed as a single bit cell with capacitors 712 and 715 in complementary states, or as a two-bit cell. This structure, like the structure of cell 100 of FIG. 1, is excellent in a high noise environment, such as embedded memory, since the ferroelectric capacitors 712, 715 are completely isolated except when they are being addressed. However, as will be seen in more detail below, the write cycle is approximately half of the write cycle of cell 100; thus, a memory with a cell 700 is extremely fast.

Figure 8:
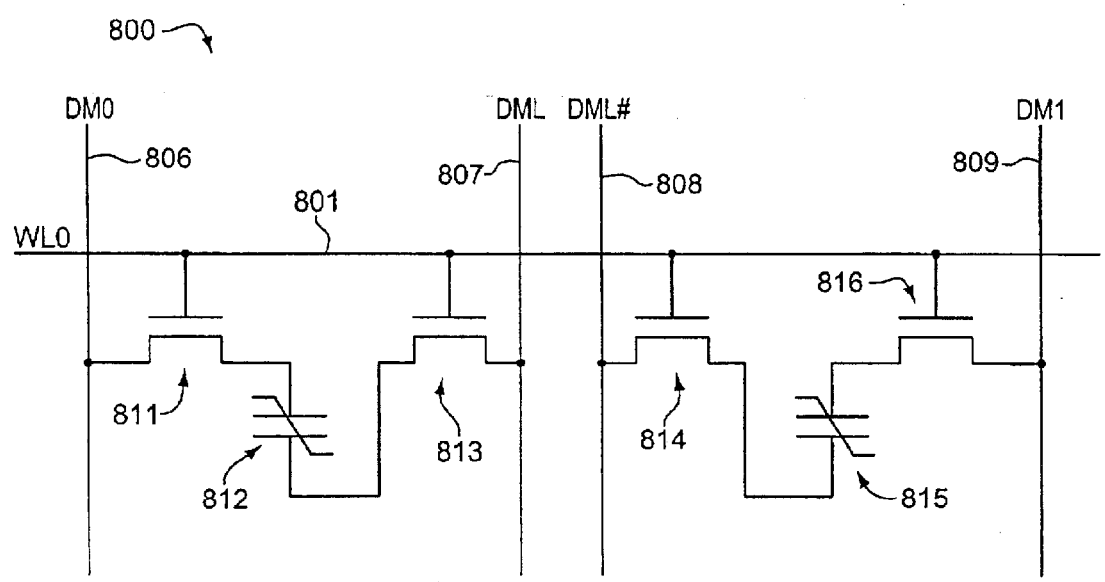
FIG. 8 is an electrical circuit diagram of an alternative preferred embodiment of a dummy memory cell according to the invention.

FIG. 8 shows a dummy cell 800 in which transistors 811, 813, 814, and 816 and capacitors 812 and 815 are connected to bit lines 806 and 809, word line 801, and drive lines 807 and 808, just as the corresponding transistors and capacitors are connected in cell 700. In this structure, dummy lines 807 and 808 always have complementary signals, as do bit lines 806 and 809.

Sense amplifiers 402 (FIG. 4) and 502 (FIG. 5) are preferably used with the one-bit embodiment of cell 700 and the two-bit embodiment of cell 700 as described above for cell 100 of FIG. 1.

Figure 9:
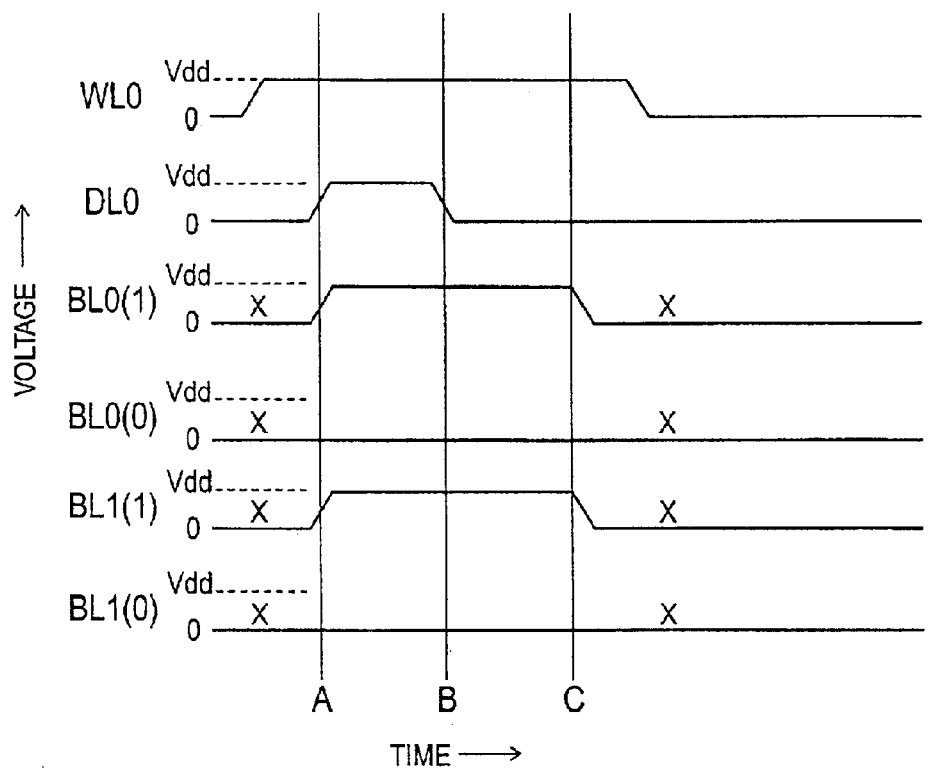
FIGS. 9–12 are timing diagrams illustrating the write function according to four alternative preferred embodiments of the invention.

Turning now to FIG. 9, a timing diagram is shown for a preferred embodiment of the write function for memory cell 100. As is conventional in the art, in the timing diagram of FIG. 9, time progresses to the right along the x-axis while, for each of the six curves, voltage is along the y-axis. The timing diagram illustrates the relative timing for each of the pertinent signals WL0, DL0, BL0(1), BL0(0), BL1(1) and BL1(0) shown in FIG. 1. BL0(1) and BL1(1) are the bit line signals for the logic "1" state, while BL0(0) and BL1(0) are the bit line signals for the logic "0" state. As is known in the art, the choice of which of the ferroelectric states is a logic "1" and which is a logic "0" is arbitrary, and the opposite choice would work as well. The write cycle starts with the word line going high. The high voltage is written as Vdd. The word line may rise to the Vdd voltage as shown, or preferably, may be boosted to a voltage higher than Vdd, as is known in the art. The drive line signal DL0 then goes high. The "X" on the bit line signals at the start and end of the bit line signals means "Don't Care", which, as known in the art, means that the state of the signal in this area does not matter. If a logic "1" state is to be written to a capacitor, the bit line signal, BL0(1) or BL1(1), rises with DL0. Since the voltage on both electrodes of the capacitors is the same, nothing is written in the period A to B for this state. However, in the second half of the cycle, at time "B", DL0 goes low. Since BL0(1) and BL1(1) stay high, a voltage of approximately Vdd is placed across the capacitors and logic "1" is written in these conditions. The bit line signals BL0(0) and BL1(0) stay low when a logic "0" is to be written to a capacitor. In this case, in the period A to C, a voltage of approximately Vdd in the opposite direction is placed across the capacitors, and a logic "0" is written to the capacitors. Thus, in general, when DL0 is high, a logic "0" may be written in a cell, and when DL0 is low, a logic "1" may be written to a capacitor. Of course, in the one-bit, complementary mode, opposite states are written to the capacitors.

Figure 10:
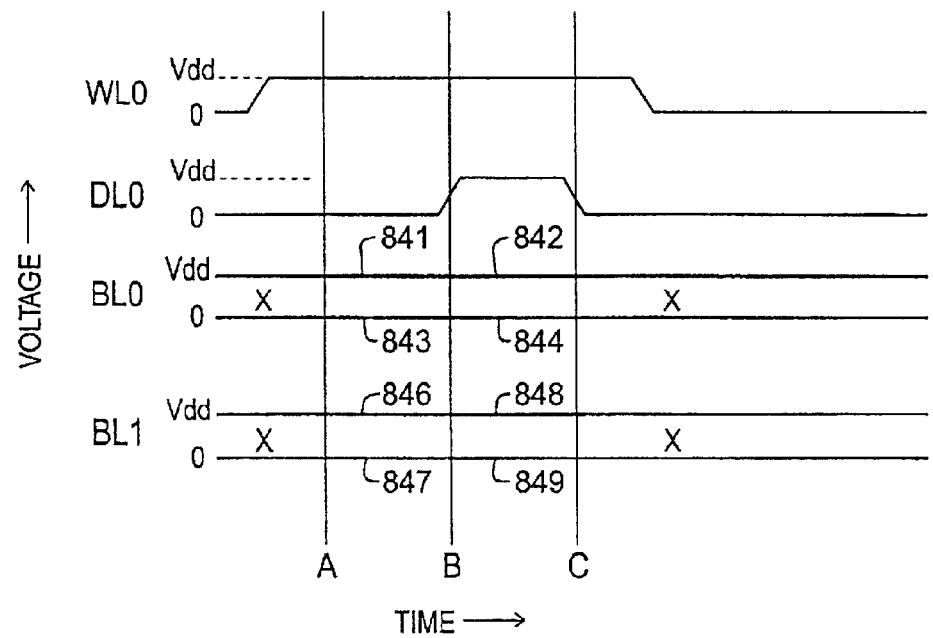

A timing diagram for an alternative writing function is shown in FIG. 10. In this figure, for compactness, both the logic "1" bit line signal and the logic "0" bit line signal are shown together, with the signal for the logic "1" state labeled with a "1" and the signal for the logic "0" state labeled with a "0". In this case, DL0 is low in period A to B, and high in period B to C. Thus, at 841 and 846, a logic "1" is written and at 844 and 849, a logic "0" is written. At 843, 849, 842, and 848, there is no voltage across the capacitor, and nothing is written. Thus, in the function of FIG. 10, a logic "1" is written in the first half of the cycle, and a logic "0" is written in the second half of the cycle.

Figure 11:
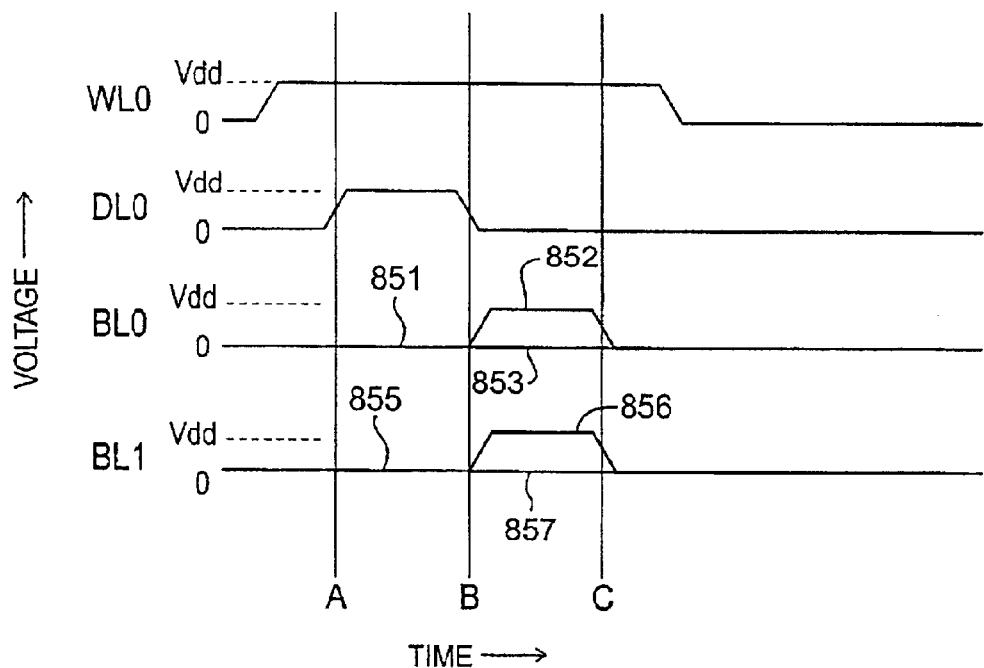
Figure 12:
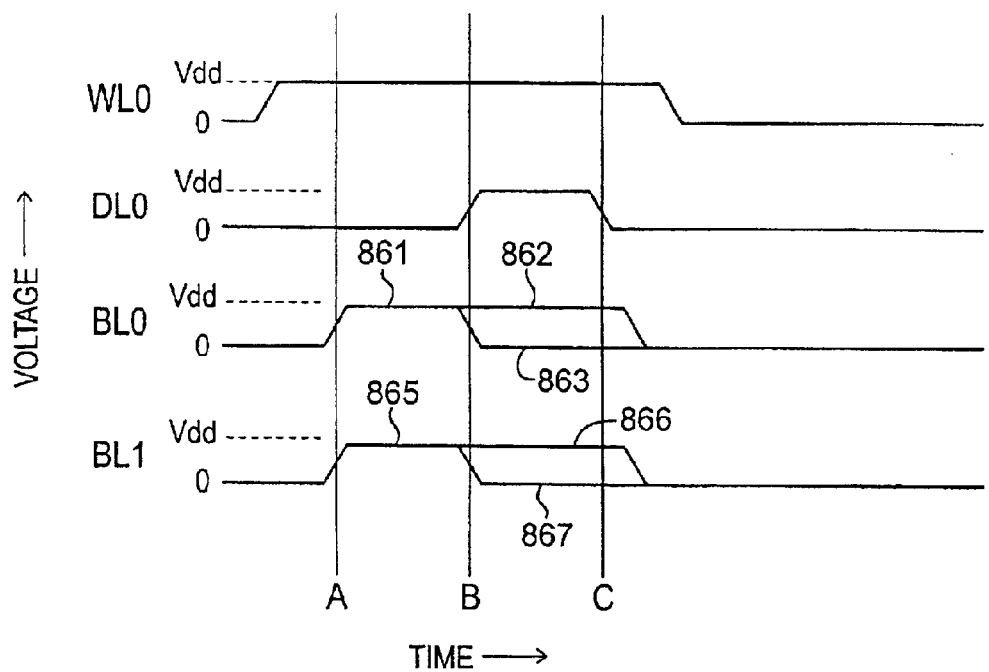

Another alternative writing method is shown in FIG. 11. In this method, a logic "0" is written to both capacitors 106 and 108 in the first half of the cycle at 851 and 855, and, if it is desired to write a logic "1", this is done in the second half of the cycle at 852 or 856. If the state to be written is a logic "0", the bit lines stay low, and at 853 and 857 nothing is written, and the logic "0" written in the first half of the cycle remains. In this method of writing, the correct data can come in later in the cycle. Another alternative in which the correct data can come in later is shown in FIG. 12. In this embodiment, the drive line signal, DL0, is low in the first half of the cycle and high in the second. Thus, a logic "1" is written to both capacitors 106 and 108 in the first half of the cycle at 861 and 865, and then, if needed, a logic "0" is written in the second half of the cycle at 863 or 867. If the state to be written is a logic "1", the bit lines stay high, and nothing is written at 862 and 866.

Figure 13:
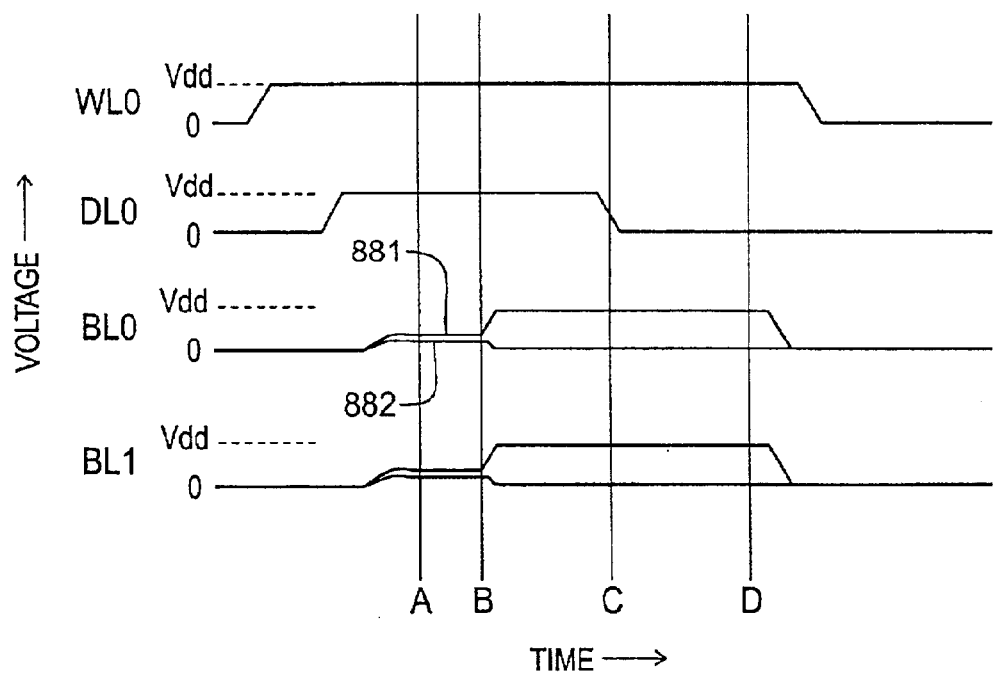
FIGS. 13–16 are timing diagrams illustrating the read function according to four alternative preferred embodiments of the invention.

FIG. 13 shows a selective destructive read out (SDRO) method of reading cell 100. In this method, the bit lines are at zero voltage at the start of the cycle and the drive line signal, DR0, goes high after the word line signal, WL0, goes high. This causes a voltage to be placed on the bit lines. If the capacitor is in the logic "1" state, the ferroelectric capacitor switches and the voltage impressed on the bit line is higher, as at 881. If the capacitor is in the logic "0" state, the ferroelectric capacitor does not switch and the voltage impressed on the bit line is lower, as at 882. The sense amplifier then, in time period B to C, separates the voltages and forces the high signal to a logic "1" or high state, and the low signal to a logic "0" or low state. Also, in time period B to C, the logic "0" state is re-written in the capacitors that were in a logic "0" state. The drive line goes low at C. If the capacitor was in a logic "0" state, there is no voltage across the capacitor because the corresponding bit line is also low and the capacitor stays in this state. If the capacitor was in a logic "1" state, a voltage of approximately Vdd is placed across the capacitor and it is re-written to a logic "1" state in period C to D. This method of reading is very robust, since any disturbance of a capacitor state caused by the read function, such as by a power surge or drop during the read cycle, is corrected by a positive rewrite.

Figure 14:
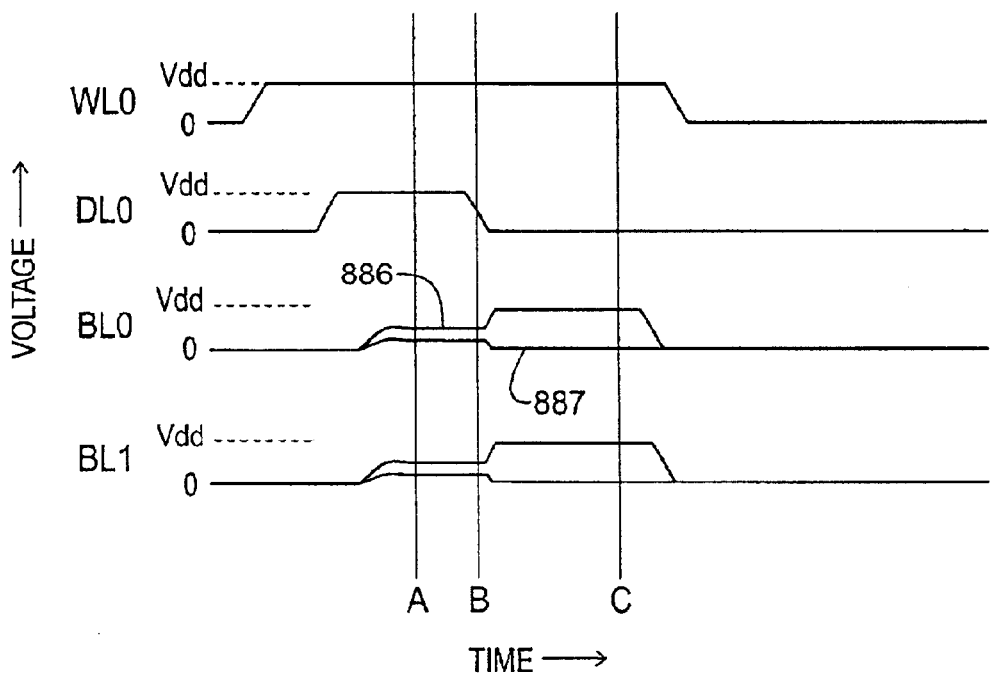

FIG. 14 shows an alternative selective destructive read out (SDRO) method. Again, in this method the bit lines start low, and the drive line goes high after the word line goes high. In the BL0 signal, the bit line voltage for a bit line corresponding to a capacitor that is in the logic "0" state is shown at 887, and the voltage for a bit line corresponding to a capacitor in the logic "1" state is shown at 886. The voltages are the same for the BL1 signal. Again, the voltages impressed on the bit line are different for the two logic states, and the sense amplifier drives the bit line of the logic "0" capacitors low and the logic "1" capacitors high. This method takes advantage of the fact that in the period A to B, the DL0 pulse is always higher than the bit line, and thus, this pulse should not disturb a capacitor in the logic "0" state. Thus, the rewrite of the logic "0" state is not necessary, and at B the drive line signal, DL0, goes low. Since the bit line corresponding to a capacitor that was in the logic "0" state is being driven low in the period B to C, there is no voltage across the capacitor, and it stays in the logic "0" state. However, the bit line for the capacitor that was in the logic "1" state is being driven high, which places a voltage of about Vdd across the capacitor and rewrites it to the logic "1" state. The bit lines then drop to the low state, which causes nothing to happen since the drive line is already in the low state. The read function of this method is faster, though not quite as robust as that of the method of FIG. 13.

Figure 15:
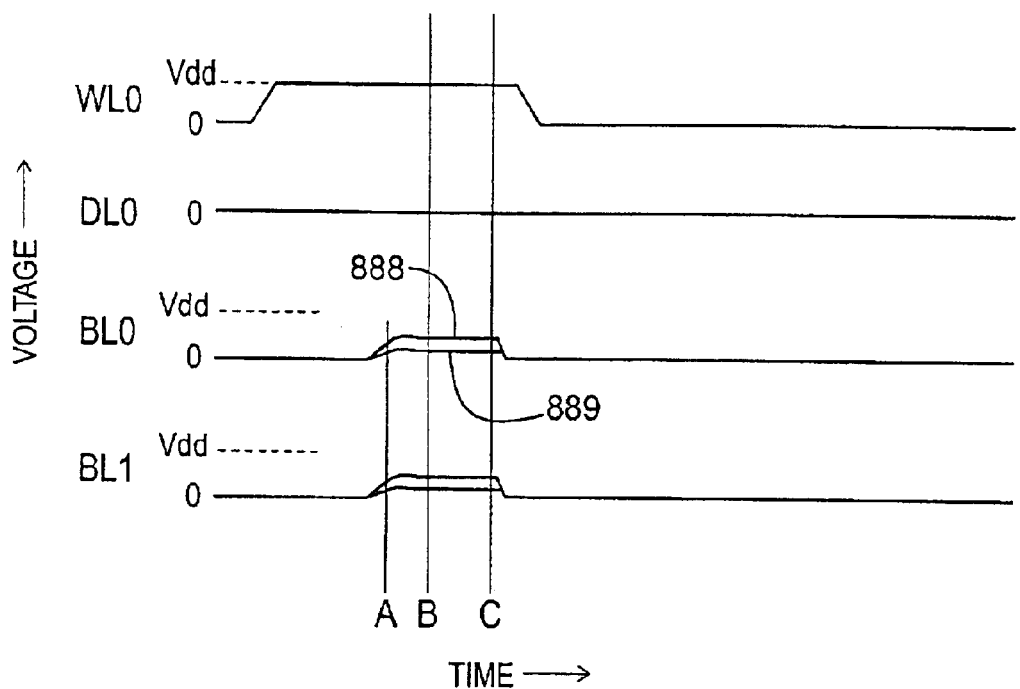
Figure 17:
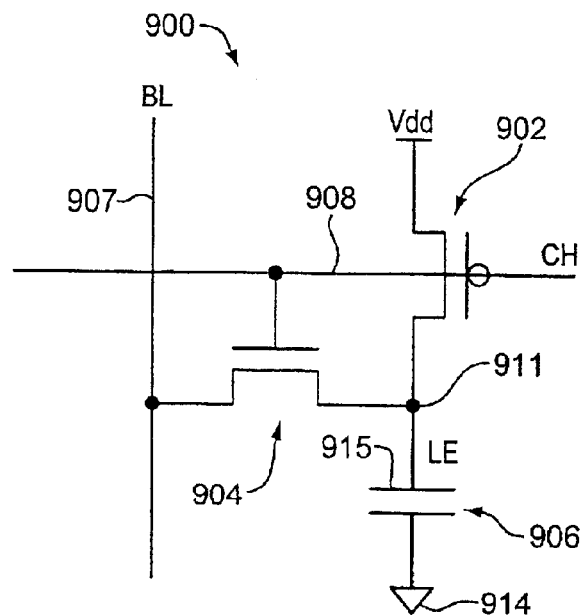
FIG. 17 is an electrical circuit diagram of a bit line driver circuit for the read function according to a preferred embodiment of the invention.

The above reading methods illustrate that the memory cell according to the invention can be read reliably and fast in a destructive readout mode which, except for the alternating "0" and "1" states to which the dummy cells are programmed, is similar to read methods in the prior art. However, the invention also provides a very fast and preferred method of reading the memory cell which is very different from the prior art in that it is a selective non-destructive read out method. Turning to FIG. 15, a preferred embodiment of the selective non-destructive read out method (SNDRO) is illustrated in the timing diagram of FIG. 15. Again, the read cycle starts by WL0 going high. However, in this method, DL0 stays low. Instead, a small charge is placed on bit lines 102 and 104 (FIG. 1), which creates a voltage on the bit line, which voltage is significantly less than the coercive voltage required to switch the cell. A bit line driver that provides such a voltage is shown in FIG. 17 and will be described below. How the ferroelectric capacitor reacts to this small voltage is also discussed below in connection with FIG. 19. For now, it just needs to be noted that a ferroelectric capacitor in the logic "1" state, i.e., the state that has a polarization in the same direction as the field caused by the impressed voltage when the DL line is lower than the bit line, has a smaller capacitance than a ferroelectric capacitor in the logic "0" state. Thus, it will absorb less charge than a ferroelectric capacitor in the logic "0" state, and, when the small voltage is applied, a bit line corresponding to a capacitor in the logic "1" state will end up at a higher voltage than a bit line in the logic "0" state. That is, a capacitor that would have switched if the voltage had been in the same direction but above the coercive voltage will also tend to absorb more charge even when it does not switch. Thus, as shown at curves 888 and 889 in FIG. 15, the voltage in both the bit line associated with a capacitor in the logic "1" state and the bit line associated with a capacitor in the logic "0" state first rises and then falls back as the ferroelectric capacitor charges. Since the capacitor in the logic "1" state does not take up as much charge due to its lower capacitance, the bit line associated with the capacitor in the logic "1" state will rise to a higher voltage than the bit line in the logic "0" state. Since the ferroelectric capacitors do not switch, they do not need to be rewritten. After time C, the bit lines are forced low by a precharge circuit as known in the art and the word line goes low ending the cycle. This cycle is extremely fast because there is no rewrite. In this embodiment, the voltages on the bit lines are output to a data output circuit 479 external of the array where they are amplified and output to output 435, and thus the bit lines are not driven to the rails, which further saves cycle time.

Figure 16:
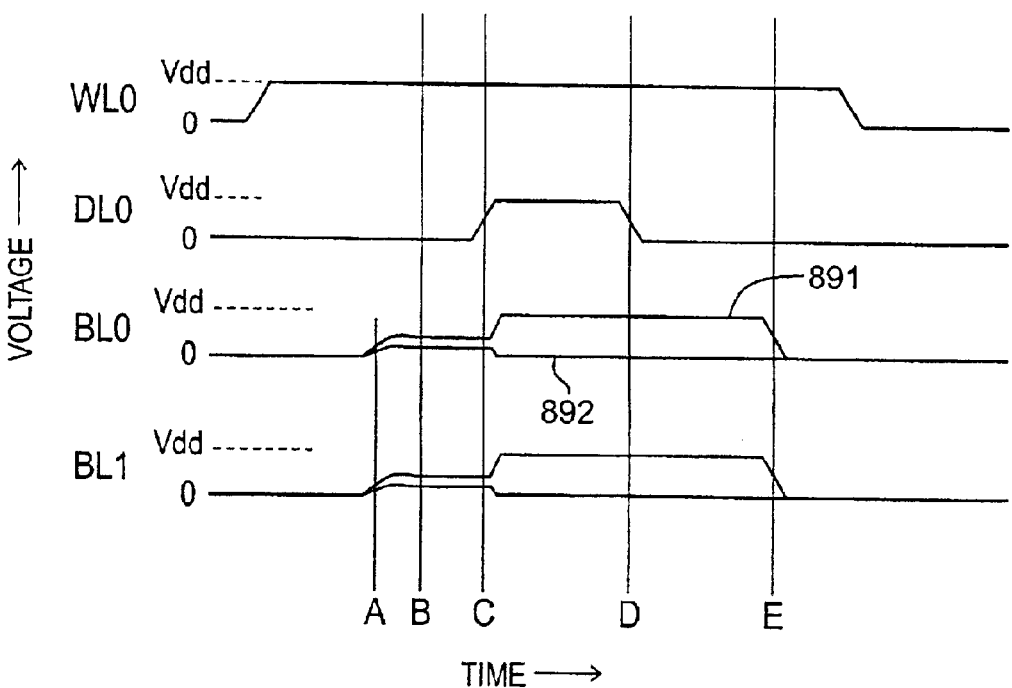

FIG. 16 shows another preferred alternative of a selective non-destructive read out (SNDRO) method according to the invention. This method starts the same as the method of FIG. 15, with the word line going high and the drive line staying low while a small voltage is applied to the bit lines. However, in this case, the drive line goes high in the period C to D immediately following the sense period B to C. In this case, the sense amplifier drives the bit lines to the rails, with the high bit line, i.e., the bit line corresponding to the capacitor in the logic "1" state, being driven to Vdd, as illustrated by curve 891, and the bit line corresponding with the low voltage, i.e., the bit line corresponding to the capacitor in the logic "0" state, being driven to zero voltage, as illustrated by curve 892. Since the DL0 signal is also high, there is no voltage across the capacitor that was in the logic "1" state, and it remains in the logic "1" state. However, there is a voltage across the capacitor that was in the logic "0" state and it is rewritten to a logic "0" state. Then, at time D, the DL0 goes low. The voltage across the capacitor in the logic "0" state goes to zero, and it stays in the same state. The voltage across the capacitor that was in the logic "1" state goes to Vdd, and a logic "1" is rewritten to it. Then both bit lines drop to zero. This reading method is slower than the reading method of FIG. 16, but it also "resets" the capacitors back to their original state in case the read function has disturbed them slightly. However, though it is longer than the SNDRO read cycle of FIG. 15, it is shorter than the destructive read cycles discussed above, as well as those of the prior art, because the rewrite periods do not have to be as long since the capacitors are already essentially in the state that is being rewritten. Thus, this read method provides a very robust read cycle that is shorter than the read cycles of the prior art.

Turning now to FIG. 17, a bit line drive circuit 900 is shown that provides the small charge for the read methods of FIGS. 15 and 16. Drive circuit 900 includes two transistors 902 and 904 and a capacitor 906. Transistor 902 has an inverted gate. Transistor 902 may also be a P-channel transistor while transistor 904 is an N-channel transistor. Capacitor 906 may be a ferroelectric capacitor or a conventional linear capacitor. The inverted gate of transistor 902 is connected to "charge" line 908. One source/drain of transistor 902 is connected to Vdd, while the other source drain is connected to electrode 915 of capacitor 906, which is preferably the lower electrode. The other electrode of capacitor 906 is connected to ground 914. Node 911 between transistor 902 and electrode 915 is also connected to bit line 907 through transistor 904, the gate of which is connected to charge line 908. P channel transistor 902 can be replaced with a P/N transmission gate or any gating element which will turn ON when CH is low. Likewise, the N channel transistor 904 can also be replaced with a P/N transmission gate or any gating element which will turn ON when CH is high.

Figure 18:
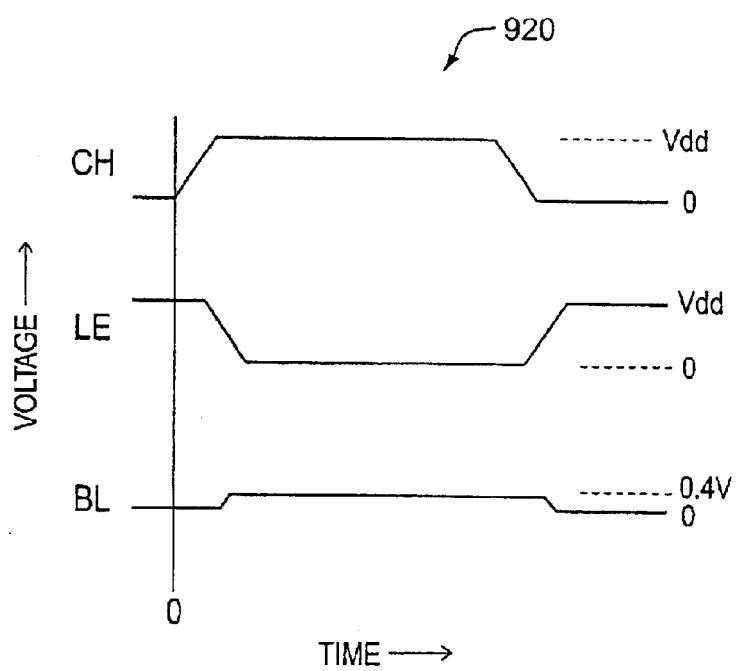
FIG. 18 is a timing diagram for the circuit of FIG. 17.

A timing diagram 920 showing the operation of bit line driver 900 is shown in FIG. 18. At the start of a cycle, the CH signal on the charge line is low, which means that transistor 902 is on and transistor 904 is off. Thus, electrode 915 is pulled high, and the LE signal, which represents the voltage state of this electrode, is high. Then the CH signal on the charge line goes high, which turns off transistor 902 and turns on transistor 904, which permits the positive charge on electrode 915 to be dumped onto bit line 907, causing the voltage BL on the bit line to rise a small amount. The capacitance of capacitor 906 is carefully selected and matched with the capacitance of bit line 907 so that the rise in voltage on the bit line is enough to drive the read operation, but not enough to significantly disturb the ferroelectric capacitor of the memory cell connected to the bit line. Preferably, with the current state of the art of ferroelectric capacitors and memory cell technology, capacitor 915 is selected so that the voltage the bit line rises to is one-third or less of the high voltage source of the memory, i.e., the Vdd voltage. More preferably, it is one-fourth or less of the memory high voltage.

Figure 19:
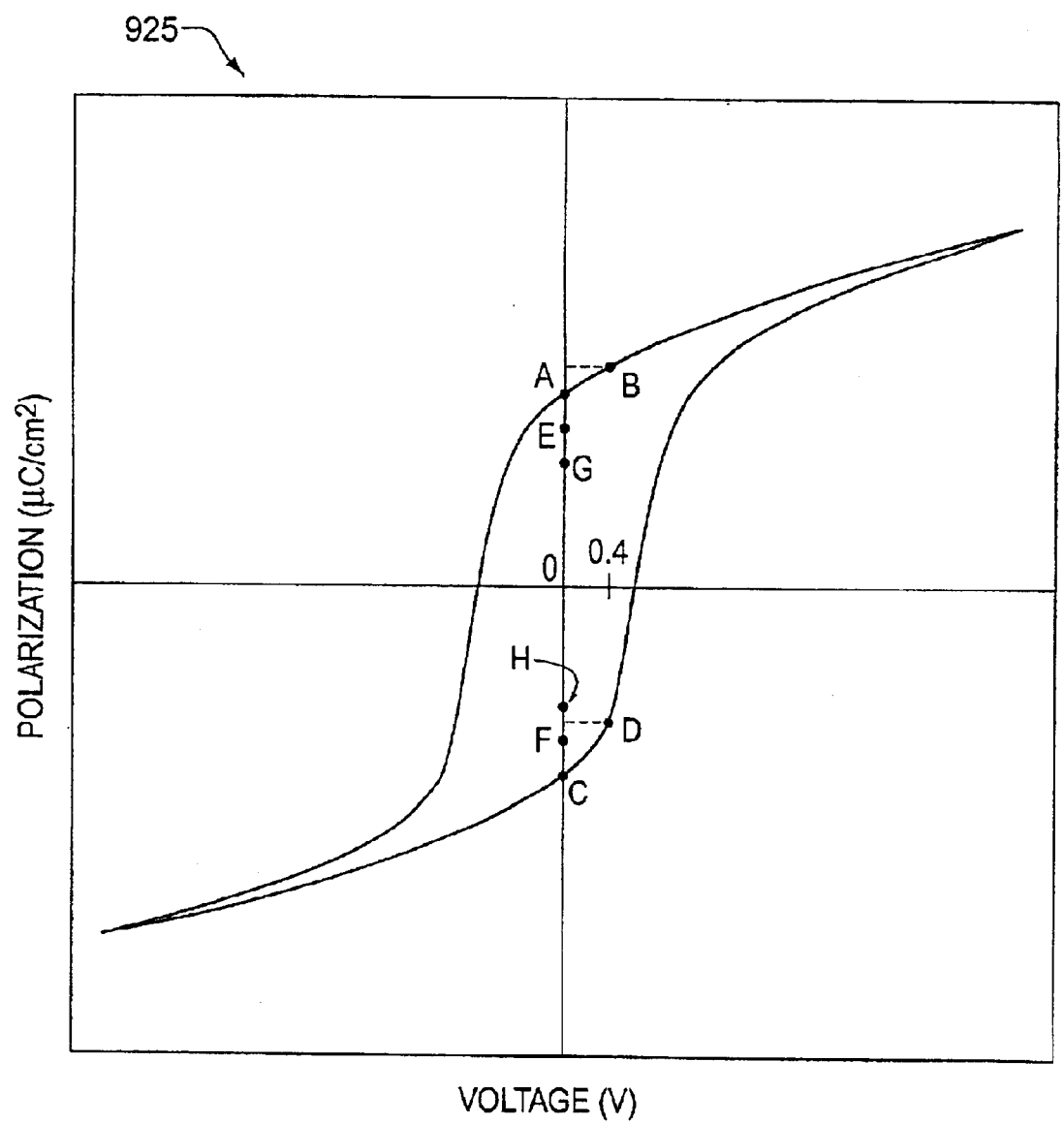
FIG. 19 shows an exemplary hysteresis curve for a ferroelectric material illustrating a feature of the preferred embodiment of the read function according to the invention.

FIG. 19 is a ferroelectric hysteresis curve 925 plotting polarizability P of a ferroelectric capacitor, such as 106, versus voltage. Such hysteresis curves are well known in the art, so how it is generated need not be discussed here. At zero volts, a ferroelectric capacitor in the logic "1" state is at point A on hysteresis curve 925, while a ferroelectric capacitor in the logic "0" state is at point C. When the 0.4 volts is placed on the capacitor, the ferroelectric capacitor in the logic "1" state rises along the hysteresis curve to point B, while the ferroelectric capacitor in the logic "0" state rises to point D. Because the hysteresis curve is steeper from C to D than from A to B, the capacitor in the logic "0" state absorbs more polarization charge. Thus, the final voltage state of the bit line is lower than for the capacitor in the logic "1" state. The key fact to note from curve 925 is that the hysteresis curve is steeper for the state which would switch if the voltage applied to the capacitor was in the same direction, but larger than the coercive voltage. This is true whichever the polarization state the capacitor is in. Thus, the bit line that is lower in an SDRO cycle is also the bit line that is lower in an SNDRO cycle.

As is known in the art, when the voltage is removed from the capacitor, the capacitor in the logic "1" state falls back to about E, while the capacitor in the logic "0" state falls back to about F. Each time the capacitor is read, the capacitor returns to a state more towards zero. However, for state-of-the-art ferroelectric capacitors, there is a limit as to how much the hysteresis curve will relax, and after millions of cycles, the capacitor in the logic "1" state reaches such a point G where it will not relax any more, and the capacitor in the logic "0" state reaches the point H where it also will not relax any more. However, as is known in the art, the hysteresis curve on subsequent cycles after the first also shifts, so that the capacitor in the logic "1" state always absorbs less charge than the capacitor in the logic "0" state. The above also explains why, for a robust system, it is desirable to have a rewrite cycle even though the capacitor is not switched in the SNDRO read methods described above. The rewrite cycle returns the capacitors to the states A and C, respectively; thus, the relaxation of the capacitor does not impact the performance of the capacitor.

Turning now to FIG. 20, a portion of a memory cell array 930 according to the invention having partitioned bit lines and drive lines is shown. Array 930 includes several levels of bit lines. The top level bit line 932 is one of lines 447 of memory 436 (FIG. 6). That is, it is closer to Y Multiplexer 478. Each top level bit line, such as 932, has multiple groups of two second level bit lines 934 and 936 associated with it. The extension of the bit lines such as 932, 934 and 936 at the top and bottom of the figure is intended to indicate the preferred presence of multiple groups of second level bit lines. The number of second level bit lines will depend on layout and circuit design considerations which can be different for different implementation strategies. Each second level bit line 934, 936 is connected to the top level bit line 932 through a transistor 938 and 939, respectively. Optional discharge transistors, with one source/drain connected to the second level bit line and the other source/drain connected to ground, sometimes called precharge transistors, can also be added at node 934 and 936 to make sure that the lower level bit lines will be fully discharged when transistor 938 or 939 is selected. The gates of the discharge transistors are connected to a discharge signal that goes high during a discharge period just before a new cycle, or after a cycle is completed, and otherwise is low. The gate of transistor 938 is connected to a first group select line 940, while the gate of transistor 939 is connected to a second group select line 942. To permit the reader to connect the discussion of array 930 with the discussion of array 200 and 240 of FIG. 2, we will assume that the top left memory cell or array 930 is also the top left memory cell of arrays 200, 240, and have numbered the elements the same. To select a cell to be addressed in array 930, both a group select line and a word line corresponding to the cell must be active. For example, to select cell 100, the GRSEL1 signal must be high turning on transistor 938 and connecting second level bit line 934 to top level bit line 932, and word line 101 must be high turning on transistors 105, 107, and 109. To select a cell in the lower group, GRSEL1 is low and GRSEL2 is high.

Each second level bit line, such as 934, is connected to a small number of memory cells, e.g., 8, 16, etc. The total bit line capacitance is the sum of the top level bit line capacitance and the second level bit line capacitance. Since only one second level bit line is connected to the top level bit line when accessing a cell, the capacitances of the other second level bit lines do not affect the total bit line capacitance. Thus, the partitioning of the bit lines significantly lowers the bit line capacitance, which significantly increases the speed at which the bit line will come up to full voltage, which speeds up the memory. As memory technology progresses, 3-D memories are being designed. 3-D memories are memories in a memory cell array which is a three-dimensional structure. Bit lines, of course, must extend in the vertical direction as well as the horizontal direction for such technology. For technology with 3-D capability, the second level bit line would be the best level to be used for building up FeRAM memory cells vertically. (The second level bitlines, in this case, would be called vertical bitlines.)

Array 930 also includes several levels of drive lines. The top level drive line 941 is one of lines 447 of memory 436 (FIG. 6). That is, it is closer to Y Multiplexer 478. Each top level drive line, such as 941, has multiple groups of two second level drive lines 945 and 946 associated with it. The extension of the drive lines such as 941, 945 and 946 at the top and bottom of the figure is intended to indicate the preferred presence of multiple groups of second level drive lines. Again, the number of second level drive lines will depend on layout and circuit design considerations. Each second level drive line 945, 946 is connected to the top level drive line 941 through a transistor 943 and 944, respectively. The gate of transistor 943 is connected to first group select line 940, while the gate of transistor 944 is connected to second group select line 942. In this embodiment, the group select signals GRSEL1 and GRSEL2 select the group as described above with respect to the bit line partioning. As for the bit lines, each second level drive line, such as 943, is connected to a small number of memory cells, e.g., 8, 16, etc. The total drive line capacitance is the sum of the top level drive line capacitance and the second level drive line capacitance. Since only one second level drive line is connected to the top level drive line when accessing a cell, the capacitances of the other second level drive lines do not affect the total drive line capacitance. Thus, the partitioning of the drive lines significantly lowers the drive line capacitance, which significantly increases the speed at which the drive line will come up to full voltage, which speeds up the memory.

While in the embodiment shown in FIG. 20 both the bit lines and drive lines are partioned, in other embodiments only the bit lines or only the drive lines may be partioned. Additional levels below the second level may exist also. The important aspect is that there is a hierarchy of bit lines and/or drive lines, with each top level line connecting with multiple second level lines through transistors, each second level connecting line connecting with multiple third level lines through transistors, etc. Word lines may also be partioned in a similar manner to the bit and drive lines.

Since cell 100 has an extra transistor as compared to conventional DRAM designs, it would seem that it would be somewhat less dense than a comparable complementary mode DRAM design, or a comparable DRAM design using dummy cells. However, while the density of the cell portion of the memory is somewhat more than conventional designs sometimes labeled as 1T/1C, the advantages of isolation and low power lead to an overall low density when the support structures that every memory must have are considered. Since the capacitors that are not addressed are isolated and their capacitance does not contribute to the drive and bit line capacitance, the arrays may be made much larger than previous arrays of ferroelectric memories, without having huge bit line and drive line drivers, and without having a plate line driver for each row of cells, as in some prior art memories. Since the supporting structure is much smaller, the overall memory density is smaller. As compared to DRAMs, refresh circuitry is not required because the memory is non-volatile. Moreover, the drive line located between the bit lines permits an efficient design of the memory, and at the same time reduces cross-talk between the bit lines, which allows all the elements of the array to be more compact.

The memory according to the invention also uses much less power than prior art designs. The large capacitances which required large bit line and drive line drivers, or drivers for each row of cells in come cases, inherently results in a high power requirement. Moreover, in prior art designs, many non-addressed cells were continually being powered up. This is wasteful of power and is eliminated in the memory according to the invention.

In addition to the density and low power that the isolated capacitors and other features of the invention provide, the reduced capacitance also greatly enhances the speed of the memory. The reduced capacitance means that the time for the voltage lines to stabilize is smaller, and the cycle time is also correspondingly smaller. The isolation also leads to less noise, and completely eliminates disturb to a non-selected memory cell due to other memory cells being written to or read. This lower noise and elimination of many of the sources of disturb permits a reliable SNDRO read function, which is extremely fast.

There has been described herein a memory having three transistors and two capacitors, a drive line symmetrically located between bit lines, and having numerous other novel features. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiment described, without departing from the inventive concepts.

Figure 21:
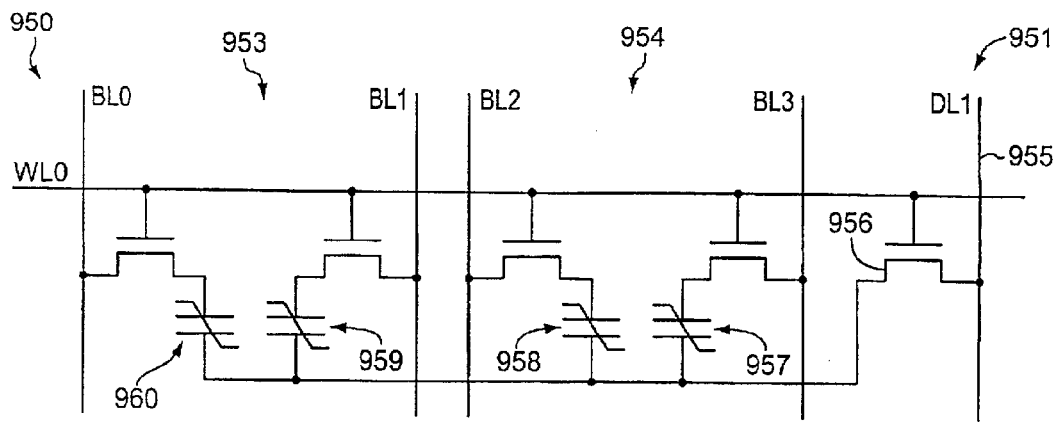
FIG. 21 is an electrical circuit diagram of an alternative preferred embodiment of a portion of a memory array having a two-bit 4C/5T memory cell.
Figure 22:
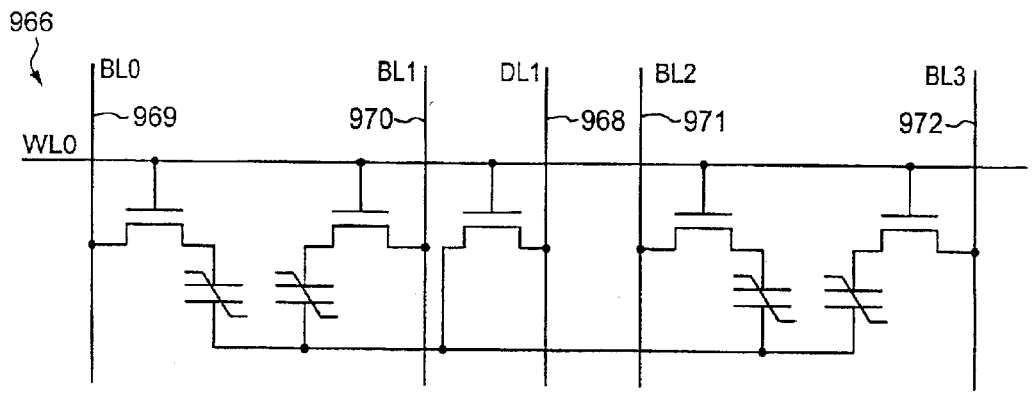
FIG. 22 is an electrical circuit diagram of another alternative preferred embodiment of a portion of a memory array that is the same as the array of FIG. 21 except that the drive line is located between the bit line pairs.
Figure 23:
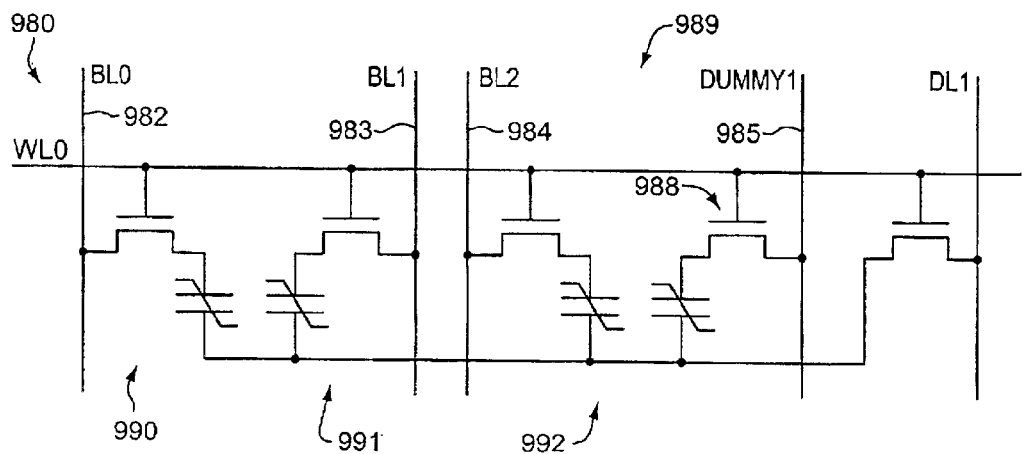
FIG. 23 is an electrical circuit diagram of another alternative preferred embodiment of a portion of a memory array similar to that of FIG. 21 except it includes a dummy bit line and capacitor.

Some examples of memory array structures that utilize features and advantages of the invention are shown in FIGS. 21–23. FIG. 21 is an electrical circuit diagram of a portion 950 of a memory array in which each drive line 955 and drive line transistor 956 is associated with a pair of two transistor, two ferroelectric capacitor memory cells 953 and 954. In this embodiment, a single drive line 955 is connected to each of capacitors 957, 958, 959 and 960. Otherwise, the circuit is the same as circuit 100 of FIG. 1. Circuit 950 may be considered as a single two-bit cell 951 having four capacitors and five transistors, or as two one-bit cells 953 and 954 with a drive line 955 connected to the two cells through a drive transistor.

FIG. 22 is an electrical circuit diagram of a portion 966 of a memory array that is the same as array 950 except that drive line 968 is located between bit line pairs 969, 970 and 971, 972. This embodiment may also be considered as a single two-bit cell or two one-bit cells. This embodiment is more preferred than the embodiment of FIG. 21, since it has less noise and the layout is more balanced and efficient.

FIG. 23 shows another embodiment of a portion 980 of a memory array that has the same structure as the embodiment of FIG. 21, except that bit line pairs 982, 983 and 984, 985 are not complementary, capacitor 988 is a dummy capacitor, and bit line 985 is a dummy bit line. Circuit 980 can be considered to be a single three-bit cell 989 or three one-bit cells 990, 991, and 992.

The embodiments of FIGS. 21–23 are more dense and faster than any prior art ferroelectric memories, but are a bit slower than the previous embodiments, and use more power. If one attempts to use more than four capacitors attached to a single drive line, the drivers and support circuitry become so large and the speed decreases so much that most of the advantages of the invention are lost. Layout efficiencies are also lost.

The invention has been described in terms of a ferroelectric memory in which the ferroelectric elements are capacitors. However, many of its aspects can also be applied to ferroelectric memories in which the ferroelectric elements are ferroelectric FETs or other ferroelectric elements. See, for example, U.S. Pat. No. 6,339,238 issued Jan. 15, 2002 to Lim et al., which is incorporated herein by reference as though fully disclosed herein. Many of the elements, such as the structure in which cells are completely isolated, are also applicable to DRAMs.

It is also evident that the device elements and acts recited may, in some instances, be performed in a different order; or equivalent structures may be substituted for the various structures described; or a variety of different materials may be used. Consequently, the invention is to be construed as embracing each and every novel feature and novel combination of features present in and/or possessed by the system, devices, and method described.

We claim:

1. A ferroelectric, non-volatile memory comprising: a plurality of pairs of parallel bit lines and a plurality of memory cells, each said memory cell associated with one of said pairs of bit lines, each said memory cell comprising: a first ferroelectric capacitor having a first electrode and a second electrode, a second ferroelectric capacitor having a first electrode and a second electrode, a first transistor having a gate, and a second transistor having a gate; wherein in each said memory cell said first transistor is connected between said first electrode of said first capacitor and one of said bit lines in said associated bit line pair, said second transistor is connected between said first electrode of said second capacitor and the other of said bit lines in said associated bit line pair; said memory further including a plurality of drive lines and a drive line transistor associated with each of said drive lines, said drive line transistor including a gate, said drive lines being parallel to said bit lines, each of said drive lines connected to the second electrode of at least one of said capacitors in at least one of said memory cells via said drive line transistor, each of said drive lines connected to two or less of said memory cells, said memory further including a word line perpendicular to said bit line pairs arid said drive lines, arid said gates of said first transistor, said second transistor and said drive line transistor connected to said word line, and wherein each of said drive lines is connected to said second electrode of said first capacitor and said second electrode of said second capacitor in two of said memory cells; and one of said two memory cells is a two-bit memory cell and the other of said two memory cells is a one-bit memory cell including a dummy capacitor, and said bit line connected to said dummy capacitor is a dummy bit line.

2. A ferroelectric memory as in claim 1 wherein said drive line is located between said two cells.

3. A ferroelectric memory as in claim 1 wherein there are a plurality of said word lines, each of said word lines associated with a different row of said memory cells with said gates of each of said transistors in each of said memory cells in a row of memory cells connected to said word line associated with said row; and said memory includes a drive line driver circuit connected, via said drive line, to said first and second capacitors in at least one of said memory cells in each of a plurality of said rows.

4. A ferroelectric memory comprising: a plurality of pairs of parallel bit lines and a plurality of memory cells, each said memory cell associated with one of said pairs of bit lines, each said memory cell comprising: a first ferroelectric capacitor having a first electrode and a second electrode, a second ferroelectric capacitor having a first electrode and a second electrode, a first transistor having a gate, and a second transistor having a gate; wherein in each said memory cell said first transistor is connected between said first electrode of said first capacitor and one of said bit lines in said associated bit line pair, said second transistor is connected between said first electrode of said second capacitor and the other of said bit lines in said associated bit line pair; said memory further including a plurality of drive lines and a drive line transistor associated with each of said drive lines, said drive line transistor including a gate, said drive lines being parallel to said bit lines, each of said drive lines connected to the second electrode of at least one of said capacitors in at least one of said memory cells via said drive line transistor, each of said drive lines connected to two or less of said memory cells, said memory further including a word line perpendicular to said bit line pairs end said drive lines, and said gates of said first transistor, said second transistor and said drive line transistor connected to said word line; and wherein said bit lines are top level bit lines and there are a plurality of said memory cells divided into a first group and a second group, said memory further including a first group select transistor having a gate, a second group select transistor having a gate, a first group select line, a second group select line, a first second level bit line, and a second second level bit line, and wherein said first group select transistor is connected between said top level bit line and said first second level bit line, said second group select transistor is connected between said top level bit line and said second second level bit line, said first group select line is connected to said gate of said first group select transistor, and said second group select line is connected to said gate of said second group select transistor.

5. A ferroelectric memory comprising: a plurality of pairs of parallel bit lines and a plurality of memory cells, each said memory cell associated with one of said pairs of bit lines, each said memory cell comprising: a first ferroelectric capacitor having a first electrode and a second electrode, a second ferroelectric capacitor having a first electrode and a second electrode, a first transistor having a gate, and a second transistor having a gate; wherein in each said memory cell said first transistor is connected between said first electrode of said first capacitor and one of said bit lines in said associated bit line pair, said second transistor is connected between said first electrode of said second capacitor and the other of said bit lines in said associated bit line pair; said memory further including a plurality of drive lines and a drive line transistor associated with each of said drive lines, said drive line transistor including a gate, said drive lines being parallel to said bit lines, each of said drive lines connected to the second electrode of at least one of said capacitors in at least one of said memory cells via said drive line transistor, each of said drive lines connected to two or less of said memory cells, said memory further including a word line perpendicular to said bit line pairs and said drive lines, and said gates of said first transistor, said second transistor and said drive line transistor connected to said word line; and wherein said bit lines are complementary and each of said memory cells is a one-bit memory cell, and further including a digital high voltage source and a bit line driver circuit for driving said bit line to a voltage that is one-third or less of said digital high voltage source of said memory.

6. A ferroelectric memory as in claim 5 wherein there are a plurality of pairs of said complementary bit lines.

7. A ferroelectric memory comprising: a plurality of pairs of parallel bit lines and a plurality of memory cells, each said memory cell associated with one of said pairs of bit lines, each said memory cell comprising: a first ferroelectric capacitor having a first electrode and a second electrode, a second ferroelectric capacitor having a first electrode and a second electrode, a first transistor having a gate, and a second transistor having a gate; wherein in each said memory cell said first transistor is connected between said first electrode of said first capacitor and one of said bit lines in said associated bit line pair, said second transistor is connected between said first electrode of said second capacitor and the other of said bit lines in said associated bit line pair; said memory further including a plurality of drive lines and a drive line transistor associated with each of said drive lines, said drive line transistor including a gate, said drive lines being parallel to said bit lines, each of said drive lines connected to the second electrode of at least one of said capacitors in at least one of said memory cells via said drive line translator, each of said drive lines connected to two or less of said memory cells, said memory further including a word line perpendicular to said bit line pairs and said drive lines, and said gates of said first transistor, said second translator and said drive line transistor connected to said word line; and wherein each of said memory cells is a two-bit memory cell.

8. A ferroelectric memory as in claim 7 wherein one of said pairs of bit lines are dummy bit lines, said memory cell associated with said dummy bit line pair is a dummy cell, and said drive line connected to said dummy cell is a dummy drive line.

9. A ferroelectric memory as in claim 8 wherein said dummy bit lines are complementary.

10. A ferroelectric memory as in claim 9 wherein, during a first memory cycle, the logic state of said first capacitor in said dummy cell is a logic "0" and the logic state of said second capacitor in said dummy cell is a logic "1", and during a second memory cycle the logic state of said first capacitor in said dummy cell is a logic "1" and the logic state of said second capacitor in said dummy cell is a logic "0".

11. A ferroelectric memory as in claim 9, and further including a sense amplifier having three bit line inputs, two of said inputs connected to said pair of dummy bit lines.

12. A ferroelectric memory comprising: a plurality of pairs of parallel bit lines and a plurality of memory cells, each said memory cell associated with one of said pairs of bit lines, each said memory cell comprising: a first ferroelectric capacitor having a first electrode and a second electrode, a second ferroelectric capacitor having a first electrode and a second electrode, a first transistor having a gate, and a second transistor having a gate; wherein in each said memory cell said first transistor is connected between said first electrode of said first capacitor and one of said bit lines in said associated bit line pair, said second transistor is connected between said first electrode of said second capacitor and the other of said bit lines in said associated bit line pair; said memory further including a plurality of drive lines and a drive line transistor associated with each of said drive lines, said drive line transistor including a gate, said drive lines being parallel to said bit lines, each of said drive lines connected to the second electrode of at least one of said capacitors in at least one of said memory cells via said drive line transistor, each of said drive lines connected to two or less of said memory cells, said memory further including a word line perpendicular to said bit line pairs and said drive lines, and said gates of said first transistor, said second transistor and said drive line transistor connected to said word line; and wherein there are two of said drive lines and two of said drive line transistors associated with each of said cells, one of said two drive lines connected to said second electrode of said first capacitor via a first one of said two drive line transistors and the other of said two drive lines connected to said second electrode of said second capacitor via a second one of said two drive line transistors.

13. A ferroelectric memory as in claim 12 wherein said pair of bit lines associated with each of said cells are complementary.

14. A ferroelectric memory as in claim 12 wherein each of said cells is a two-bit cell.

15. A ferroelectric memory as in claim 14 wherein one of said cells includes a dummy capacitor.

16. A ferroelectric memory as in claim 15 wherein said cell that includes a dummy capacitor is a dummy cell having a pair of dummy bit lines connected to a pair of dummy capacitors and a pair of dummy drive lines connected to said pair of dummy capacitors.

17. A ferroelectric memory as in claim 16 wherein, during a first memory cycle, the logic state of said first capacitor in said dummy cell is a logic "0" and the logic state of said second capacitor in said dummy cell is a logic "1", and during a second memory cycle the logic state of said first capacitor in said dummy cell is a logic "1" and the logic state of said second capacitor in said dummy cell is a logic "0".

18. A ferroelectric, non-volatile memory comprising a pair of complementary bit lines, a drive line located between and parallel to said complementary bit lines, a word line perpendicular to said bit lines and drive line, and a memory cell comprising: a first ferroelectric capacitor, a second ferroelectric capacitor, a first transistor, a second transistor, and a drive line transistor; wherein said first transistor is connected between said first capacitor and one of said complementary bit lines, said second transistor is connected between said second capacitor and the other of said complementary bit lines, and said drive line transistor is connected between at least one of said capacitors and said drive line, and wherein said memory includes a plurality of said memory cells and there is only one drive line and one drive line transistor associated with each of said memory cells, said one drive line transistor connected between said drive line and each of said first and second capacitors.

19. A ferroelectric memory comprising a pair of complementary bit lines, a drive line located between and parallel to said complementary bit lines, a word line perpendicular to said bit lines and drive line, and a memory cell comprising: a first ferroelectric capacitor, a second ferroelectric capacitor, a first transistor, a second transistor, and a drive line transistor; wherein said first transistor is connected between said first capacitor and one of said complementary bit lines, said second transistor is connected between said second capacitor and the other of said complementary bit lines, and said drive line transistor is connected between at least one of said capacitors and said drive line, and wherein said memory includes a plurality of said memory cells and there are two of said drive lines and two of said drive line transistors associated with each of said memory veils, one of said drive line transistors connected between one of said drive lines and said first capacitor, and the other of said drive line transistors connected between the other of said drive lines and said second capacitor.

20. A ferroelectric memory comprising a pair of complementary bit lines, a drive line located between and parallel to said complementary bit lines, a word line perpendicular to said bit lines and drive line, and a memory cell comprising: a first ferroelectric capacitor, a second ferroelectric capacitor, a first transistor, a second transistor, and a drive line transistor; wherein said first transistor is connected between said first capacitor and one of said complementary bit lines, said second transistor is connected between said second capacitor and the other of said complementary bit lines, and said drive line transistor is connected between at least one of said capacitors and said drive line, and wherein said bit lines are top level bit lines and there are a plurality of said memory cells divided into a first group and a second group, said memory further including a first group select transistor having a gate, a second group select transistor having a gate, a first group select line, a second group select line, a first second level bit line, and a second second level bit line, and wherein said first group select transistor is connected between said top level bit line and said first second level bit line, said second group select transistor is connected between said top level bit line and said second second level bit line, said first group select line is connected to said gate of said first group select transistor, and said second group select line is connected to said gate of said second group select transistor.

21. A ferroelectric memory comprising a pair of complementary bit lines, a drive line located between and parallel to said complementary bit lines, a word line perpendicular to said bit lines and drive line, and a memory cell comprising: a first ferroelectric capacitor, a second ferroelectric capacitor, a first transistor, a second transistor, and a drive line transistor wherein said first transistor is connected between said first capacitor and one of said complementary bit lines, said second transistor is connected between said second capacitor and the other of said complementary bit lines, and said drive line transistor is connected between at least one of said capacitors and said drive line, and further including a digital high voltage source and a bit line driver circuit for driving said bit line to a voltage that is one-third or less of said digital high voltage source of said memory.

22. A ferroelectric, non-volatile memory of the type having a plurality of memory cells arranged in rows and columns, each column comprising a bit line coupled to memory cells along the column, each row comprising a word line coupled to cells along the row, said memory also including a plurality of drive lines distinct from said bit and word lines, each said memory cell coupled to a corresponding drive line, each said memory cell comprising a ferroelectric element, the polarization of said ferroelectric element corresponding to the data stored therein, said memory also including a signal generator providing a read signal, the improvement wherein two of said bit lines are complementary dummy bit lines and one of said bit lines is not a dummy bit line; said memory further comprises: a sense amplifier having a first bit line input connectable to said bit line that is not a dummy bit line, a second bit line input connectable to a first one of said dummy bit lines, and a third bit line input connectable to a second one of said dummy bit lines.

23. A ferroelectric memory as in claim 22, and further including a write circuit for writing said first dummy bit line to a logic "0" state during a first memory cycle and for writing said first dummy bit line to a logic "1" state during a second memory cycle.

24. A ferroelectric memory as in claim 22 wherein said sense amplifier includes a circuit for combining the input signals from said first and second dummy bit lines.

25. A ferroelectric memory as in claim 22 wherein said ferroelectric element is a ferroelectric capacitor.

26. A ferroelectric, non-volatile memory having a plurality of memory cells arranged in rows and columns, each column comprising a bit line coupled to memory cells along the column, each row comprising a word line coupled to cells along the row, said memory also including a plurality of drive lines distinct from said bit and word lines, each said memory cell coupled to a corresponding drive line, each said memory cell comprising a ferroelectric element, the polarization of said ferroelectric element corresponding to the data stored therein, the improvement wherein said bit fines are top level bit lines and there are a plurality of said memory cells divided into a first group and a second group, said memory further including a first group select transistor having a gate, a second group select transistor having a gate, a first group select line, a second group select line, a first second level bit line, and a second second level bit line, and wherein said first group select transistor is connected between said top level bit line and said first second level bit line, said second group select transistor is connected between said top level bit line and said second second level bit line, said first group select line is connected to said gate of said first group select transistor, and said second group select line is connected to said gate of said second group select transistor.

27. A ferroelectric memory as in claim 26 wherein said bit lines are organized into complementary pairs of bit lines.

28. A ferroelectric memory as in claim 26 wherein said bit lines include a dummy bit line.

29. A ferroelectric memory as in claim 28 wherein there are two dummy bit lines and said two dummy bit lines are complementary dummy bit lines.

30. A ferroelectric memory as in claim 26 wherein there are multiple sets of said first group and said second group.

31. A ferroelectric memory as in claim 26 wherein each said second level bit line includes a bit line discharger.

32. A ferroelectric memory as in claim 26 wherein each of said second level bit lines is arranged in a vertical direction.

33. A method of operating a ferroelectric, non-volatile memory of the type having a plurality of memory cells arranged in rows and columns, each column comprising a bit line pair coupled to memory cells along the column, each row comprising a word line coupled to cells along the row, said memory also including a plurality of drive lines distinct from said bit and word lines, each said memory cell coupled to a corresponding drive line, each said memory cell comprising a pair of ferroelectric capacitors, the polarization of each of said ferroelectric capacitors corresponding to the data stored therein; said method comprising: electrically isolating each of said ferroelectric capacitor pairs from all other ferroelectric capacitor pairs, and wherein said memory includes a pair of dummy bit lines and a plurality of associated dummy cells and said electrically isolating includes electrically isolating each of said dummy cells from all of the other dummy cells and all of said memory cells.

34. A method as in claim 33 wherein each of said drive lines is coupled to the memory cells along a column and each of said memory cells in said column includes a plurality of transistors, a first one of said transistors connected between a first one of said ferroelectric capacitors and a first one of said bit lines in said bit line pair associated with said column, a second one of said transistors connected between a second one of said ferroelectric capacitors and a second one of said bit lines in said bit line pair associated with said column, and a third one of said transistors connected between at least one of said ferroelectric capacitors and said drive line associated with said column, and said electrically isolating comprises keeping said first, second and third transistors associated with each said memory cell in said column off except when said associated memory cell is selected to be addressed, and selecting only one memory cell in said column at a time.

35. A method as in claim 34 wherein said third transistor is connected between said first ferroelectric capacitor and a first associated drive line and each of said memory cells includes a fourth transistor connected between said second ferroelectric capacitor and a second associated drive line, and said keeping comprises keeping said fourth transistor in said column off except when said associated memory cell is selected to be addressed.

36. A method as in claim 33 wherein said isolating includes writing to one of said memory cells while maintaining said isolation.

37. A method as in claim 36 wherein said writing comprises writing a first predetermined logic state during a first time period and writing a second predetermined logic state during a second time period.

38. A method of operating a ferroelectric, non-volatile memory of the type having a plurality of memory cells arranged in rows and columns, each column comprising a bit line pair coupled to memory cells along the column, each row comprising a word line coupled to cells along the row, said memory also including a plurality of drive lines distinct from said bit and word lines, each said memory cell coupled to a corresponding drive line, each said memory cell comprising a pair of ferroelectric memory elements, the polarization of each of said ferroelectric memory elements corresponding to the data stored therein; said method comprising: electrically isolating each of said ferroelectric memory element pairs from all other ferroelectric memory element pairs wherein said isolating includes writing to one of said memory cells while maintaining said isolation, and said writing comprises writing a first predetermined logic state to both of said ferroelectric memory elements in one of said pairs of elements and then writing a second predetermined logic state to any of said ferroelectric elements in said pair for which the data applied to said memory requires that it be in a state other than the first predetermined state.

39. A method of operating a ferroelectric, non-volatile memory of the type having a plurality of memory cells arranged in rows and columns, each column comprising a bit line pair coupled to memory cells along the column, each row comprising a word line coupled to cells along the row, said memory also including a plurality of drive lines distinct from said bit and word lines, each said memory cell coupled to a corresponding drive line, each said memory cell comprising a pair of ferroelectric memory elements, the polarization of each of said ferroelectric memory elements corresponding to the data stored therein; said method comprising: electrically isolating each of said ferroelectric memory element pairs from all other ferroelectric memory element pairs wherein said isolating includes writing to one of said memory cells while maintaining said isolation, and wherein said isolating includes reading one of said memory cells while maintaining said isolation.

40. A method as in claim 39 wherein said reading comprises a destructive read out method.

41. A method as in claim 39 wherein said reading comprises a non-destructive read out method.

* * * * *

UNITED STATES PATENT AND TRADEMARK OFFICE
CERTIFICATE OF CORRECTION

PATENT NO.    : 6,809,949 B2
DATED         : October 26, 2004
INVENTOR(S)   : Iu-Meng Tom Ho It is certified that error appears in the above-identified patent and that said Letters Patent is hereby corrected as shown below:

Column 24,
Line 61, delete "said bit line pairs arid said drive lines, arid said gates of said" and insert
-- said bit line pairs and said drive lines, and said gates of said --

Column 25,
Line 37, delete "word line perpendicular to said bit line pairs end said drive" and insert
-- word line perpendicular to said bit line pairs and said drive --

Column 26,
Line 40, delete "line translator, each of said drive lines connected to two or" and insert
-- line transistor, each of said drive lines connected to two or --
Line 44, delete "translator and said drive line transistor connected to said" and insert
-- transistor and said drive line transistor connected to said --

Column 28,
Line 11, delete "transistors associated with each of said memory veils, one of" and insert
-- transistors associated with each of said memory cells, one of --

Signed and Sealed this

Twenty-sixth Day of April, 2005

JON W. DUDAS
*Director of the United States Patent and Trademark Office*